(12) United States Patent
Loi

(10) Patent No.: US 12,057,340 B2
(45) Date of Patent: Aug. 6, 2024

(54) HYBRID TETHERS FOR MICRO-TRANSFER PRINTING

(71) Applicant: X-Celeprint Limited, Dublin (IE)

(72) Inventor: Ruggero Loi, Ovens (IE)

(73) Assignee: X-Celeprint Limited, Dublin (IE)

( * ) Notice: Subject to any disclaimer, the term of this patent is extended or adjusted under 35 U.S.C. 154(b) by 811 days.

(21) Appl. No.: 17/112,153

(22) Filed: Dec. 4, 2020

(65) Prior Publication Data

US 2022/0181185 A1 Jun. 9, 2022

(51) Int. Cl.
*H01L 21/683* (2006.01)

(52) U.S. Cl.
CPC .......... *H01L 21/6835* (2013.01); *H01L 2221/68322* (2013.01); *H01L 2221/68354* (2013.01); *H01L 2221/68363* (2013.01)

(58) Field of Classification Search
CPC ....... H01L 21/6835; H01L 2221/68322; H01L 2221/68354; H01L 2221/68363
See application file for complete search history.

(56) References Cited

U.S. PATENT DOCUMENTS

| | | |
|---|---|---|
| 7,622,367 B1 | 11/2009 | Nuzzo et al. |
| 7,799,699 B2 | 9/2010 | Nuzzo et al. |
| 7,943,491 B2 | 5/2011 | Nuzzo et al. |
| 8,039,847 B2 | 10/2011 | Nuzzo et al. |
| 8,506,867 B2 | 8/2013 | Menard |
| 8,722,458 B2 | 5/2014 | Rogers et al. |
| 8,877,648 B2 | 11/2014 | Bower et al. |
| 8,889,485 B2 | 11/2014 | Bower |
| 9,142,468 B2 | 9/2015 | Bower et al. |
| 9,217,541 B2 | 12/2015 | Bathurst et al. |
| 9,358,775 B2 | 6/2016 | Bower et al. |
| 9,520,537 B2 | 12/2016 | Bower et al. |
| 9,548,233 B2 | 1/2017 | Golda et al. |
| 9,601,356 B2 | 3/2017 | Bower et al. |
| 9,640,715 B2 | 5/2017 | Bower et al. |
| 9,741,592 B2 | 8/2017 | Hu et al. |
| 9,761,754 B2 | 9/2017 | Bower et al. |
| 9,929,053 B2 | 3/2018 | Bower et al. |
| 10,714,374 B1 | 7/2020 | Cok et al. |
| 10,832,934 B2 | 11/2020 | Trindade et al. |
| 10,832,935 B2 | 11/2020 | Bower et al. |
| 2015/0371874 A1* | 12/2015 | Bower ................. H01L 24/83 257/798 |
| 2016/0093600 A1 | 3/2016 | Bower et al. |

(Continued)

OTHER PUBLICATIONS

Cok, R. S. et al., AMOLED displays with transfer-printed integrated circuits, Journal of SID, 19(4):335-341, (2011).

(Continued)

*Primary Examiner* — Alicia J Weydemeyer
*Assistant Examiner* — Laura B Figg
(74) *Attorney, Agent, or Firm* — Choate, Hall & Stewart LLP; Michael D. Schmitt

(57) ABSTRACT

A micro-device structure comprises a source substrate comprising sacrificial portions laterally spaced apart by anchors. At least a portion of each of the sacrificial portions is exposed through an opening. A micro-device is disposed on (e.g., exclusively in direct contact with) each of the sacrificial portions and laterally attached to one of the anchors by a hybrid tether. The hybrid tether comprises an organic tether layer and an inorganic tether layer.

19 Claims, 24 Drawing Sheets

(56) References Cited

U.S. PATENT DOCUMENTS

2017/0358703 A1\* 12/2017 Bower ................. H01L 33/007
2019/0051552 A1   2/2019 Bower et al.
2019/0385885 A1   12/2019 Trindade

OTHER PUBLICATIONS

Cok, R. S. et al., Inorganic light-emitting diode displays using micro-transfer printing, Journal of the SID, 25(10):589-609, (2017).
Hamer et al., 63.2: AMOLED Displays Using Transfer-Printed Integrated Circuits, SID 09 Digest, 40(2):947-950 (2009).

\* cited by examiner

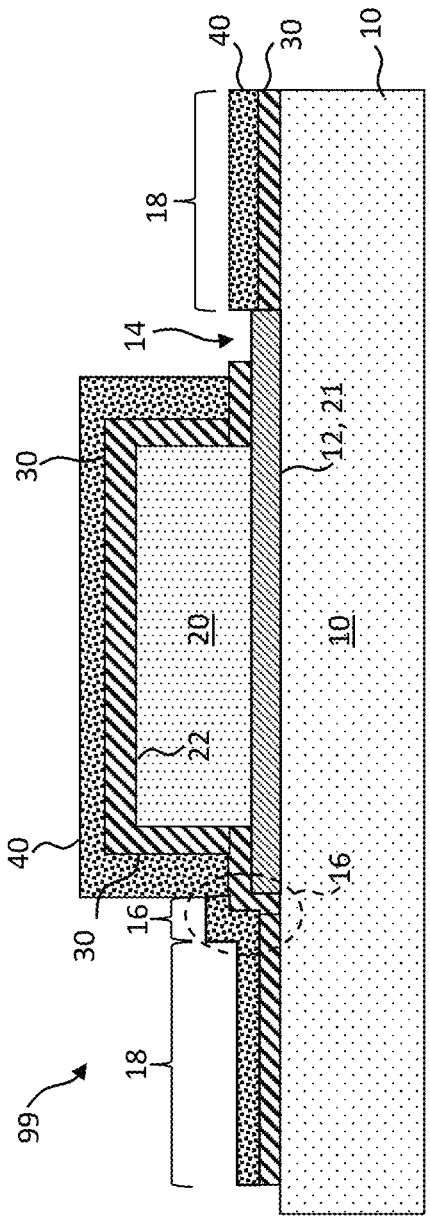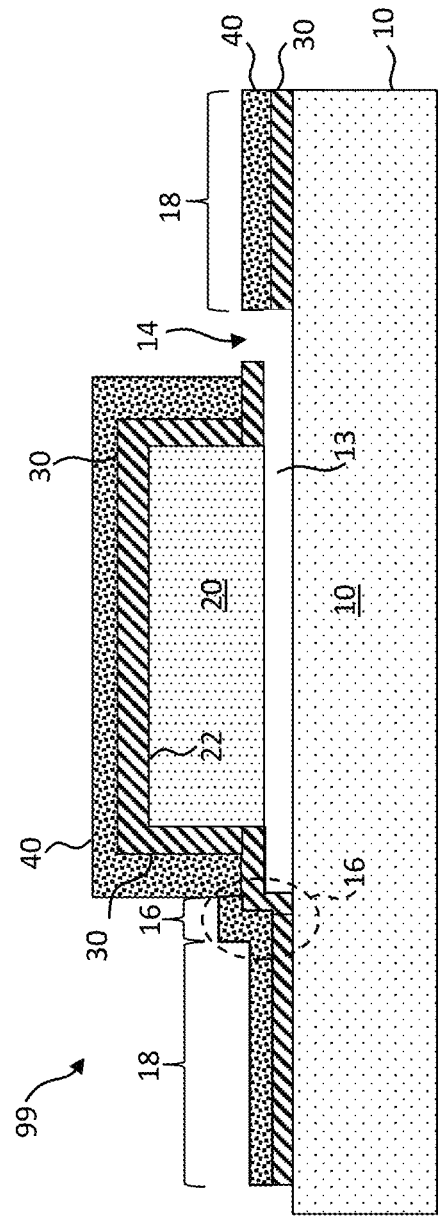

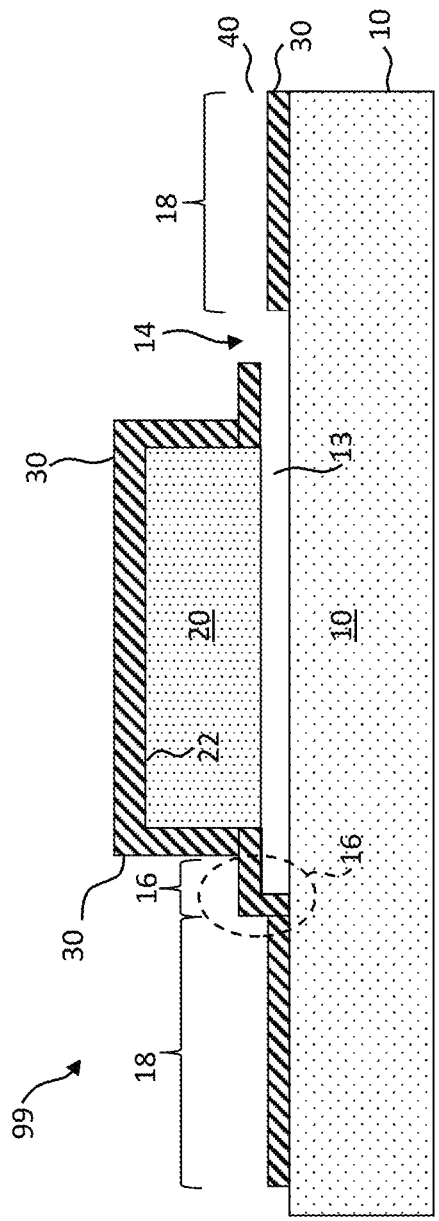
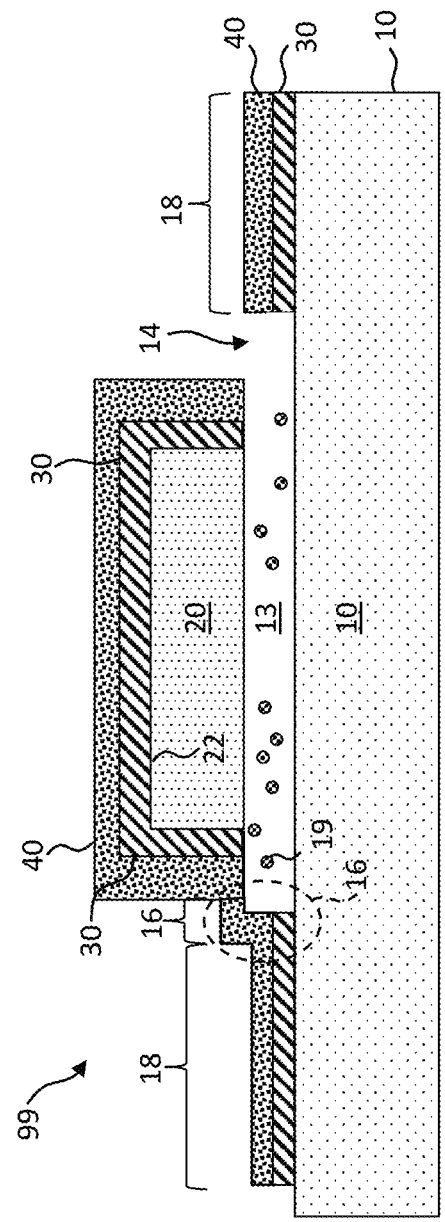

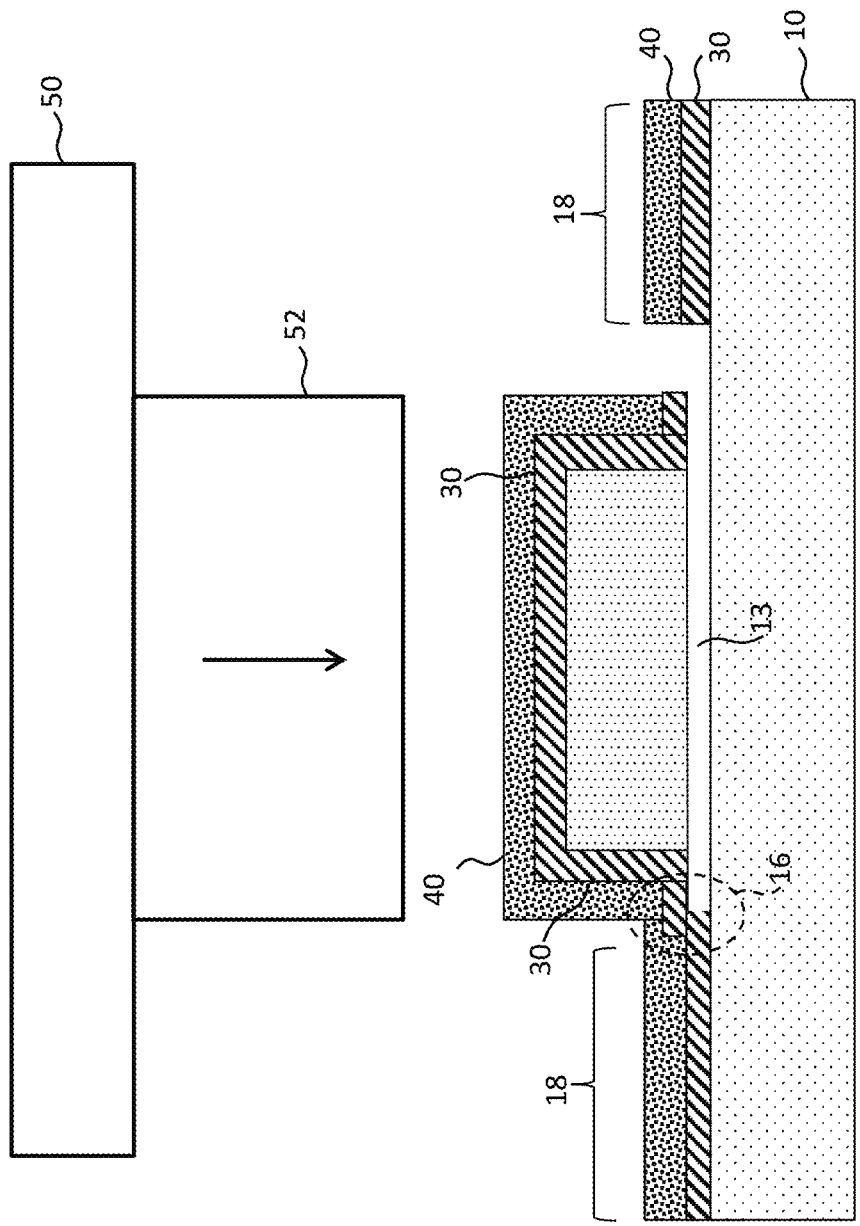

HYBRID TETHERS FOR MICRO-TRANSFER PRINTING

TECHNICAL FIELD

The present disclosure relates generally to transfer printing micro-devices from source wafers and, in particular, to tethers physically connecting micro-devices to source wafers.

BACKGROUND

Substrates with components such as electronically active devices or other structures distributed over the extent of the substrate can be used in a variety of electronic systems, for example, flat-panel imaging devices such as flat-panel liquid crystal or organic light emitting diode (OLED) display devices and in flat-panel solar cells. A variety of methods may be used to distribute components over a substrate, including forming the components on the substrate, for example forming thin-film transistors made using photolithographic methods and materials on the substrate, and forming the components on separate wafers using integrated circuit techniques and transferring the components to a substrate, for example using pick-and-place tools or micro-transfer printing.

One exemplary micro-transfer printing method for transferring active components from one substrate to another is described in *AMOLED Displays using Transfer-Printed Integrated Circuits* published in the Proceedings of the 2009 Society for Information Display International Symposium Jun. 2-5, 2009, in San Antonio Tex., US, vol. 40, Book 2, ISSN 0009-0966X, paper 63.2 p. 947 and in *Inorganic light-emitting diode displays using micro-transfer printing* published in the Journal of the Society for Information Display 25/10, 2017, 1071-0922/17/2510-06, DOI# 10.1002/jsid.610, p. 589. In this approach, small integrated circuits are formed over a patterned sacrificial layer on the process side of a crystalline wafer. The small integrated circuits, or chiplets, are released from the wafer by etching the patterned sacrificial layer beneath the circuits. A PDMS stamp is pressed against the wafer and the process side of the chiplets is adhered to the stamp. The chiplets are removed from the wafer by the stamp and are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane. There remains a need for tether structures and micro-transfer printing methods that efficiently, accurately, and precisely enable the transfer of a wide variety of micro-devices from a source wafer to a destination substrate with high yields.

SUMMARY

In some examples of micro-transfer printing, after a patterned sacrificial layer is etched and before chiplets are transferred, the chiplets remain attached by tethers to anchors in the wafer so that their physical spatial relationship to the wafer is maintained and the chiplets can be printed accurately and precisely. It is important that the tether maintain the position of the chiplet with respect to the wafer and allow a stamp to break (e.g., fracture) the tether thereby separating the chiplet from the anchor during the micro-transfer printing process. If the tether is too fragile, the chiplets can detach entirely from the wafer prior to transfer printing and if the tether is too robust, the stamp cannot detach the chiplets from the wafer reliably. In either case, the result is that the chiplet is not properly transferred from the source wafer to the destination substrate. The present disclosure recognizes that composition of the tether can be the source of improper component (e.g., chiplet) transfer during micro-transfer printing (e.g., due to premature or insufficient breaking), even over a range of tether dimensions. This problem can be solved, that is suitable tethers can be made, using a hybrid composition comprising an organic layer and an inorganic layer.

In one aspect, the present disclosure is directed to a micro-device structure comprising a source substrate comprising sacrificial portions laterally spaced apart by anchors and a micro-device disposed exclusively on, for example in direct contact with, or over each of the sacrificial portions and laterally attached to one of the anchors by a hybrid tether. Each micro-device can be disposed entirely over a sacrificial portion in a direction orthogonal to a surface of the source substrate. At least a portion of each of the sacrificial portions is exposed through an opening and the hybrid tethers comprise an organic tether layer and an inorganic tether layer. The organic tether layers can be disposed on and in direct contact with the inorganic tether layers. The inorganic tether layers can be disposed adjacent to the source substrate and the organic tether layers can be disposed on a side of the inorganic tether layers opposite the source substrate, so that the inorganic tether layers are between the organic tether layers and the source substrate.

In some embodiments, for each hybrid tether the organic tether layer is thicker than the inorganic tether layer, for example the organic tether layer can be 1.5 to 15 times thicker than the inorganic tether layer. The inorganic tether layer can be no less than fifty nm thick and no greater than one μm thick, the organic tether layer can be no less than one μm thick and no greater than five μm thick, or both. In some embodiments, the inorganic tether layer comprises silicon nitride, silicon dioxide, or amorphous silicon. In some embodiments, the organic tether layer comprises photoresist, for example a positive photoresist. In some embodiments, the organic tether layer extends over at least a portion of the micro-device, the inorganic tether layer extends over at least a portion of the micro-device, or both.

The organic tether layers can encapsulate the micro-devices, the inorganic tether layers can encapsulate the micro-devices, or both. In some embodiments, the micro-devices each comprise one or more contact pads, the organic tether layers encapsulate the micro-devices except for the one or more contact pads, and the inorganic tether layers encapsulate the micro-devices including the one or more contact pads.

According to some embodiments, the sacrificial portions comprise a sacrificial material that is the same material as a material of the source substrate and the sacrificial material is an anisotropically etchable material. The sacrificial portions can be disposed in a sacrificial layer that is a layer of the source substrate, for example on a process side of the source substrate. According to some embodiments, the sacrificial material is a same material as a material of the source substrate. According to some embodiments, the sacrificial portions comprise a sacrificial material that is a different material from a material of the source substrate and the sacrificial material is differentially etchable from the material of the source substrate.

According to some embodiments, each micro-device has a micro-device length greater than or equal to 200 µm and less than or equal to 2400 µm and a micro-device width greater than or equal to 40 µm and less than or equal to 120 µm. According to some embodiments, the inorganic tether layer has a thickness of from 50 nm to 500 nm and the organic tether layer has a thickness of from 500 nm to 6 µm. According to some embodiments, each micro-device has a micro-device length and a micro-device width, and the micro-device length is five to twenty times greater than the micro-device width.

According to some embodiments, the sacrificial portions are each an etched sacrificial portion defining a gap between the micro-device disposed over the sacrificial portion and the source substrate, and the gap is exposed through the opening.

According to some embodiments, each micro-device is disposed in a micro-device layer and the hybrid tether comprises a tether device portion disposed at least partly on or over the micro-device, a tether anchor portion disposed at least partly on or over the anchor, and a tether connection portion connecting the tether device portion to the tether anchor portion. The hybrid tether is physically continuous and is disposed at least partly in the micro-device layer between the micro-device and the device anchor. The tether device portion and the tether anchor portion can be at least partly disposed in a layer farther from the source substrate than the tether connection portion.

According to some embodiments, the hybrid tether is a first hybrid tether, the micro-device is laterally attached to the one of the anchors by a second hybrid tether different from the first hybrid tether, and the second hybrid tether comprises an organic tether layer and an inorganic tether layer.

According to some embodiments, a micro-device structure comprises a source substrate comprising laterally spaced apart anchors, a micro-device laterally attached to one of the anchors by a hybrid tether, and a gap disposed between the micro-device and the source substrate such that the micro-device is suspended over the source substrate by the hybrid tether. The gap is exposed through an opening and the hybrid tether comprises an organic tether layer and an inorganic tether layer.

According to embodiments of the present disclosure, a micro-device structure comprises a micro-device and at least a portion of a hybrid tether connected to the micro-device, for example a broken (e.g., fractured) portion of the hybrid tether. At least a portion of the hybrid tether can be a flap. The organic tether layer can be no more than 5 µm long. The inorganic tether layer can be shorter than the organic tether layer.

According to embodiments of the present disclosure, a method of making a micro-device structure comprises providing a source substrate comprising sacrificial portions spaced apart by anchors, disposing micro-devices in association with the source substrate such that each of the micro-devices is disposed exclusively on, in, or over one of the sacrificial portions, depositing an inorganic tether layer over at least a portion of the source substrate and the micro-devices, depositing an organic tether layer over the inorganic tether layer, and patterning the organic tether layer and the inorganic tether layer to form (i) a hybrid tether for each of the micro-devices such that the hybrid tether laterally attaches the micro-device to one of the anchors, and (ii) an opening exposing each of the sacrificial portions.

According to some embodiments, methods of the present disclosure comprise etching the sacrificial portions to release the micro-devices from the source substrate. According to some embodiments, methods of the present disclosure comprise dry etching the inorganic tether layer. According to some embodiments, methods of the present disclosure comprise ashing the inorganic tether layer or exposing the inorganic tether layer to a plasma.

Some methods of the present disclosure comprise contacting the micro-devices with a stamp to adhere the micro-devices to the stamp, removing the stamp and the micro-devices from the source substrate, thereby fracturing the hybrid tether, adhering the micro-devices to a destination substrate, and removing the stamp from the destination substrate, thereby printing the micro-devices to the destination substrate.

According to some embodiments, each of the micro-devices comprises one or more contact pads, deposition of the inorganic tether layer is an unpatterned blanket deposition, and methods of the present disclosure comprise removing the inorganic tether layer at least from the one or more contact pads of each of the micro-devices before depositing the organic tether layer over the inorganic tether layer. According to some methods, the organic tether layer deposition is an unpatterned blanket deposition.

In some embodiments, the micro-device has at least one of a length greater than or equal to 250 µm, 500 µm, or 1000 µm, a width greater than or equal to 250 µm, 500 µm, or 1000 µm, and a thickness greater than or equal to 5 µm, 10 µm, 15 µm, 20 µm, or 50 µm.

Certain embodiments of the present disclosure provide tether structures and micro-transfer printing methods that efficiently, accurately, and precisely enable the transfer of a wide variety of micro-devices from a source wafer to a destination substrate with high yields. Embodiments of the present disclosure are particularly, but not exclusively, suited for integrated photonic devices such as lasers, modulators, photodiodes, and other photonic components.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1B is a schematic cross section illustrating an exemplary micro-device structure taken along cross section A-A' of FIG. 1A, according to illustrative embodiments of the present disclosure;

FIG. 1C is a schematic cross section illustrating an exemplary micro-device structure with a hybrid tether and an etched sacrificial portion taken along cross section A-A' of FIG. 1A, according to illustrative embodiments of the present disclosure;

FIG. 1D is a schematic cross section illustrating an exemplary micro-device structure with an inorganic tether and an etched sacrificial portion taken along cross section A-A' of FIG. 1A, according to illustrative embodiments of the present disclosure;

FIG. 1E is a schematic cross section illustrating an exemplary micro-device structure with an organic tether and an etched sacrificial portion taken along cross section A-A' of FIG. 1A, according to illustrative embodiments of the present disclosure;

FIGS. 4A-4J are successive cross sections illustrating exemplary methods and micro-device structures according to illustrative embodiments of the present disclosure;

Figure 1A:
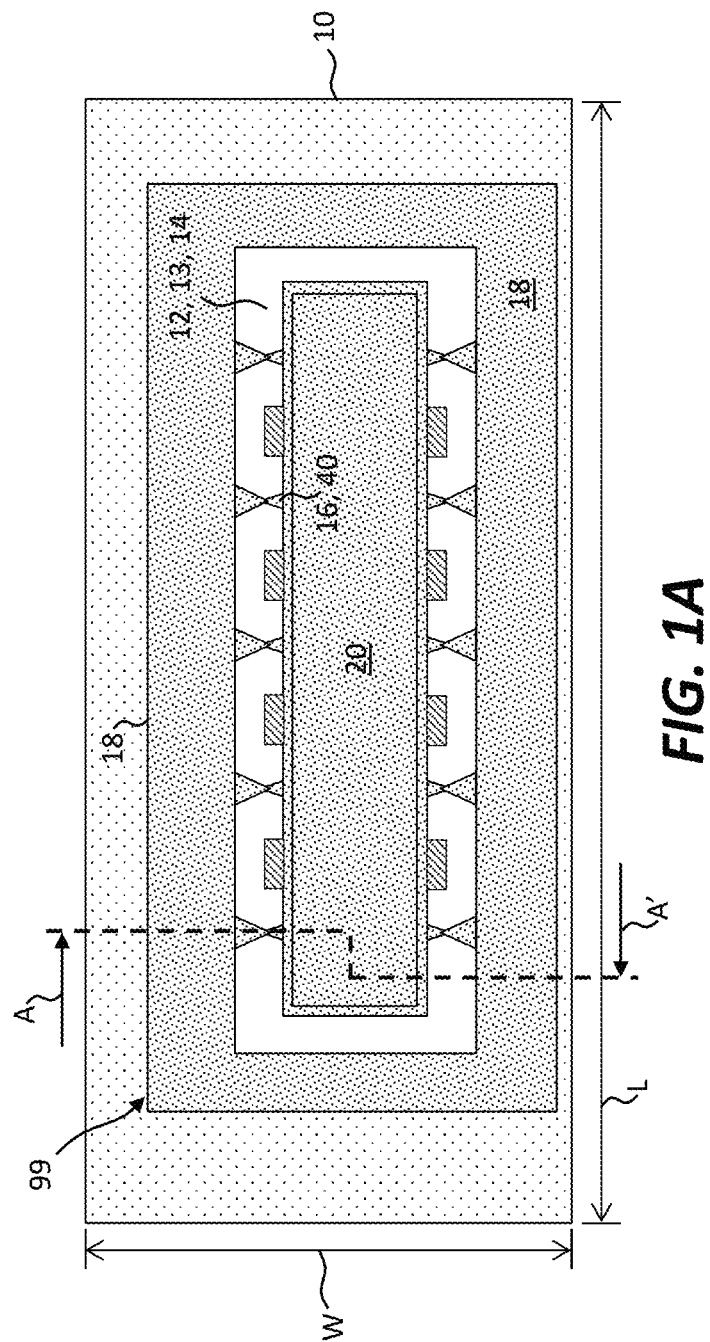
FIG. 1A is a schematic partial plan view illustrating an exemplary micro-device structure, according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Certain embodiments of the present disclosure provide, inter alia, tether structures and micro-transfer printing methods that efficiently, accurately, and precisely enable the transfer of a wide variety of micro-devices from a native micro-device source wafer (source substrate) to a target (destination) substrate with high yields. In particular, certain embodiments of the present disclosure provide tether structures particularly useful for micro-transfer printing relatively large micro-devices, for example devices having a length from 200 µm to 2400 µm, a width from 40 µm to 120 µm, and an aspect ratio defined as length to width of four to twenty. However, embodiments of the present disclosure are not limited to such micro-devices.

Micro-transfer printing enables the heterogeneous micro-assembly of micro-devices (components such as electrical, optical, and electro-optic components and integrated circuits, for example compound semiconductor micro-lasers and silicon control circuits) into a common electronic, optical, or electro-optic system, for example on a common substrate in a photonic integrated system. In some embodiments, micro-devices are formed as coupons on sacrificial portions laterally separated by anchors disposed in a sacrificial layer of a native micro-device source substrate. The micro-devices are physically connected to the anchors by tethers so that, when the sacrificial portions are etched (e.g., sacrificed to form a gap between the micro-devices and the native micro-device source substrate and release the micro-devices from the native micro-device source substrate) the micro-devices are suspended in a defined position over the gap by the tether to an anchor. A stamp (e.g., comprising a visco-elastic elastomer such as PDMS) contacts the micro-devices and adheres the micro-devices to the stamp (e.g., with van der Waals forces). The stamp and micro-devices are then removed from the native source substrate, thereby breaking (e.g., fracturing) the tether and picking up the micro-devices. The micro-devices are subsequently contacted to and adhered on (e.g., printed on) a target (e.g., destination) substrate to micro-assemble the micro-devices on the target substrate. This process can be performed multiple times with different micro-devices from different native source substrates to form a heterogeneous micro-assembly. The micro-devices can be disposed in desired spatial positions on the target substrate relative to other structures or micro-devices (e.g., optical or electronic structures or micro-devices) and electrically (or optically) connected using conventional photolithographic methods and materials, e.g., with patterned dielectric structures and electrically conducting wires. For example, a compound semiconductor micro-laser, a light-emitting diode, or an optical micro-sensor can be printed on a target substrate in close spatial proximity to a light-pipe or other optical micro-component and electrically connected to control circuits disposed in a silicon integrated circuit all micro-assembled on a common target substrate.

In order to pick up micro-devices from the native source substrate and print them to a target substrate with excellent yields and at the desired locations, it is important that the tethers physically connecting the micro-devices to the anchors of the sacrificial layer in the native source wafer maintain the position of the micro-devices with respect to the native source substrate, break (e.g., fracture) when desired at the location in the tether desired without making contaminating particles, and not inhibit successful printing. The process of etching the sacrificial portions to release the micro-devices or rinsing the native source wafer after releasing the micro-devices can physically perturb the micro-devices, causing the tethers to break during etching or rinsing rather than during pick-up, thereby dislocating or losing the micro-devices. This problem can be exacerbated with larger micro-devices. Thus, the tethers must be sufficiently strong to withstand the sacrificial portion etching process. At the same time, the tethers must be weak enough to break and enable pick up by the stamp. Furthermore, fracturing tethers in particular can make contaminating particles that can adhere to the micro-devices or stamp, preventing or inhibiting proper micro-device printing. Moreover, in some micro-assembly applications, such as photonic applications, it is important to dispose micro-devices very accurately and precisely on a target substrate, for example in contact with or within a few (e.g., 50) nm to a few (e.g., one to three) microns of a micro-structure or other micro-device on the target substrate. Since any tether remnant (flap) attached to the micro-device from tether fracturing or any contaminating particles can physically prevent close alignment of micro-devices to structures on the target substrate, it is desirable to prevent large tether remnants (flaps) and particles from forming during the tether fracturing process. Hybrid tethers according to embodiments of the present disclosure can enable such capabilities. Moreover, a hybrid tether comprising an inorganic tether layer covered with an organic tether layer can more readily cover micro-devices with a pronounced topography such as devices with sharp step (height) changes, bumps, or sharp protrusions extending from the micro-device surface. These issues are exacerbated for large micro-devices (e.g., having lengths greater than 200 μm) with large aspect ratios, (e.g., aspect ratios greater than two or four) that can require multiple tethers to provide alignment and pick-up with high yield.

Tethers comprising inorganic materials, such as inorganic silicon dioxide or silicon nitride, and tethers comprising an organic polymer such as a resin are disclosed in U.S. Patent Publication No. 2019/0051552, whose contents are incorporated by reference herein in their entirety. Experimentation performed during development has shown that inorganic tether materials can create more particles than organic tether materials and that inorganic tether materials can inhibit close alignment of structures such as micro-devices transfer printed onto a target substrate with other structures present on the target substrate, for example by causing larger tether portions (flaps) to remain attached to micro-devices after micro-transfer printing. Developmental experiments have also shown that organic tether materials are more flexible than inorganic materials thereby inhibiting a clean tether fracture, are weaker than inorganic materials and more likely to fracture during sacrificial portion etching and rinsing, and can degrade over time, inhibiting micro-device pick up. As noted, these issues are of special concern for large micro-devices with a large aspect ratio given their relative size and weight.

According to embodiments of the present disclosure, a hybrid tether comprises an organic tether layer disposed on an inorganic tether layer, for example an inorganic tether layer that is thinner than the organic tether layer. The organic tether layer material (e.g., comprising an organic material such as a photoresist, resin, or polymer) can be more flexible than the inorganic tether layer (e.g., comprising silicon dioxide or silicon nitride). When the hybrid tether fractures, the thin inorganic tether layer produces fewer contaminating particles and many or all contaminating particles produced (e.g., from the inorganic tether layer) tend to remain adhered to the organic tether layer. The inorganic tether layer provides greater strength to the hybrid tether than an all-organic tether so that the micro-device is not perturbed, and the hybrid tether is not fractured during chemical processing or rinsing steps (e.g., sacrificial portion etching). The more flexible organic tether layer and thinner inorganic tether layer used together also enable closer alignment between micro-assembled devices on a common target substrate in certain embodiments. Micro-devices with hybrid tethers can be spatially positioned closer to a structure (e.g., an alignment structure) on a target substrate because any flaps are more flexible and can bend out of the way, e.g., when physically bumping up against another structure or micro-device on the target substrate. Developmental experimentation has also demonstrated that hybrid tethers can produce smaller flaps and improve accurate fracturing at desired locations, for example as defined by a patterned notch, indent, or narrowing of the tether at the desired location, especially for relatively large micro-devices with large aspect ratios and multiple tethers.

Figure 2:
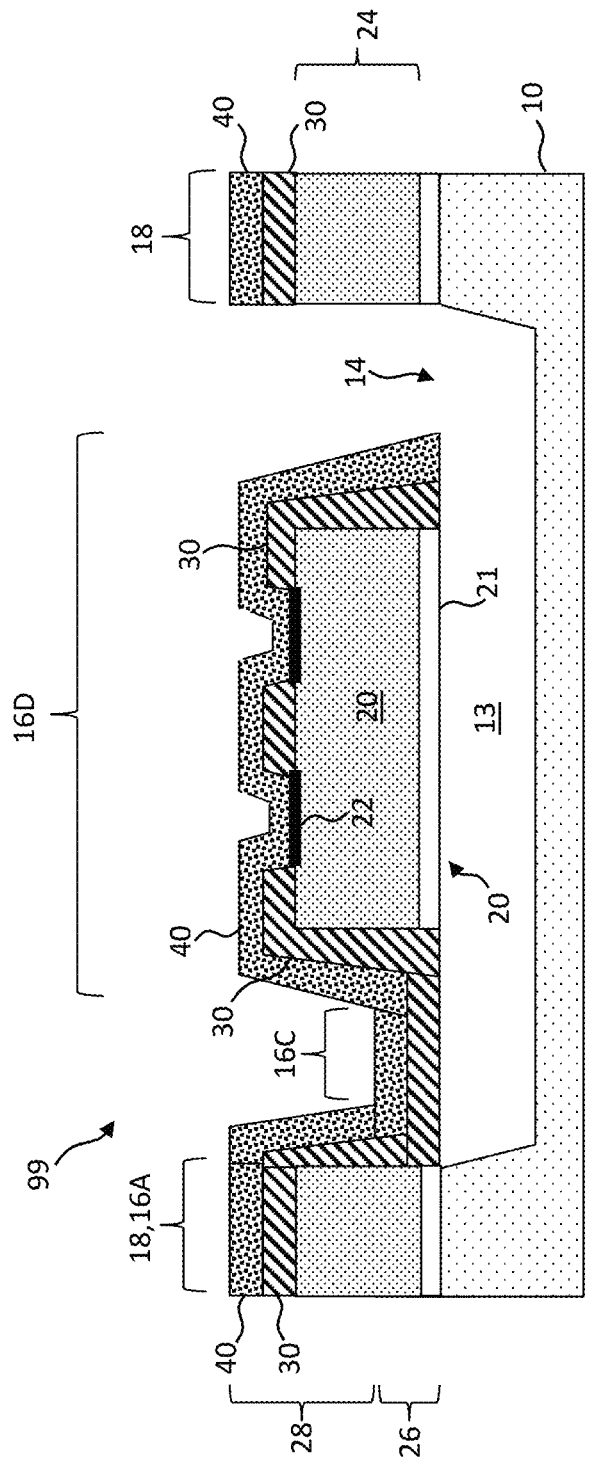
FIG. 2 is a schematic cross section illustrating an exemplary released micro-device structure according to illustrative embodiments of the present disclosure.

According to embodiments of the present disclosure and as illustrated in FIGS. 1A-1B and 2, a micro-device structure 99 comprises a source substrate 10 comprising sacrificial portions 12 laterally spaced apart by anchors 18. Sacrificial portions 12 can be portions of an insulating layer 21, as shown in FIG. 1B or designated portions of source substrate 10, as shown in FIG. 2. At least a portion (e.g., a part or a segment) of each sacrificial portion 12 is exposed through an opening 14 and a micro-device 20 is disposed exclusively on (e.g., in direct contact with) each sacrificial portion 12 (e.g., as specified by the disposition of micro-devices 20 over source substrate 10 relative to anchors 18) and laterally attached to one of anchors 18 by a hybrid tether 16. Hybrid tether 16 comprises an organic tether layer 40 and an inorganic tether layer 30. Organic tether layer 40 can be disposed on and in direct contact with inorganic tether layer 30 on a side of inorganic tether layer 30 opposite source substrate 10 and organic tether layer 40 and inorganic tether layer 30 together can form a single hybrid tether 16 that physically connects micro-device 20 to an anchor 18 and in alignment with source substrate 10.

A micro-device 20 that is disposed exclusively in direct contact with each sacrificial portion 12 is in contact only with sacrificial portion 12 and not with any other portion of source substrate 10 or structure except for one or more hybrid tethers 16 (e.g., including at least one hybrid tether 16). Micro-device 20 can be disposed or formed directly on sacrificial portion 12. In some embodiments, micro-device 20 is formed at least partially in a micro-device layer 24, for example an epitaxial layer 24 disposed on an insulating layer 21 on source substrate 10. Insulating layer 21 can be sacrificial layer 12, as in FIG. 1B, or a part of micro-device 20, as in FIG. 2. Anchors 18 of source substrate 10 can comprise a portion of epitaxial layer 24 and insulating layers 21. Epitaxial layer 24 can comprise a stack of materials, e.g., different materials or materials that are differently doped in different locations or layers. In general, micro-device 20, insulating layer 21, sacrificial layer 12, and source substrate 10 can comprise various material sets depending on the desired micro-device 20 material and structure. For example, micro-device 20 can be a semiconductor (e.g., silicon) or a compound semiconductor (e.g., a III-V or II-VI semiconductor material) as can source substrate 10.

Opening 14 can expose a portion of sacrificial portion 12 to an etchant, for example a liquid or gaseous etchant that can be introduced through opening 14 to sacrificial portions 12 to process sacrificial portions 12, for example to etch sacrificial portions 12. The shape of opening 14 can at least partially define designated areas of source substrate 10 defining sacrificial portions 12. Sacrificial portions 12 can be a solid material. In certain embodiments, a sacrificial portion 12 is etched such that the volume that was occupied by the sacrificial portion 12 defines a gap 13 separating micro-devices 20 from a source substrate 10 so that micro-devices 20 are disposed exclusively over gaps 13 in source substrate 10 between anchors 18 and micro-devices 20 and are suspended by hybrid tether(s) 16 over source substrate 10, e.g., as shown in FIGS. 4G, 4H, 6G, and 6H.

Sacrificial portions 12 are laterally distributed over a process side of a source wafer 10 and are separated by anchors 18. Anchors 18 can simply be portions of source wafer 10 or layers deposited on source wafer 10 (e.g., insulating layers 21 or epitaxial layers 24, or both) that are separate from sacrificial portions 12 and are not etched or otherwise removed from the source wafer 10 during processing. The processing can be photolithographic or integrated circuit processing using, for example, methods and materials known in the art. In some embodiments, sacrificial portions 12 are anisotropically etchable designated portions of sacrificial layer of source wafer 10, for example portions of a crystalline semiconductor material on a process side of source wafer 10. In some such embodiments, sacrificial portions 12 comprise a sacrificial material that is a same material as a source substrate 10 material (e.g., as in FIG. 2). In some embodiments, a source wafer 10 comprises a multi-layer structure including a layer of material on a process side of source wafer 10 that is differentially etchable from a remainder of source substrate 10. In some such embodiments, sacrificial portions 12 can comprise a sacrificial material that is a different material from another material of a source substrate 10 (e.g., as in FIG. 1B). The differentially etchable layer can be a patterned layer defining sacrificial portions 12 (e.g., insulating layer 21) and can comprise a material that is differentially etchable from other layers of a source wafer 10 and from a micro-device 20.

A source substrate 10 can also be a source wafer 10 (e.g., a native source wafer 10 for micro-devices 20 on or in which micro-devices 20 are formed, such as by photolithographic methods and materials) and can be any of a wide variety of relatively flat, stable materials suitable for photolithographic or integrated circuit processing, for example glass, plastic, a crystalline semiconductor such as silicon, a compound semiconductor that comprises materials such as indium phosphide, gallium nitride or gallium arsenide, quartz, or sapphire, or any suitable substrate or wafer material.

Micro-devices 20 can be any useful structure intended for micro-transfer printing and comprise any material or structure useful for the intended purpose of micro-devices 20. Micro-devices 20 can be electronic, mechanical, optical, or electro-optical structures, can be passive or active, or can be integrated circuits, electronic devices, optical devices, or opto-electronic devices. It is contemplated that there is no inherent limit to the type, function, or materials of micro-devices 20. Micro-devices 20 can comprise a same material as a material of a source substrate 10 or different materials. Micro-devices 20 can be integrated circuits, lasers, light-emitting diodes, optical sensors, or light pipes, for example, or other light emitting, sensing, or controlling devices. In some embodiments, micro-devices 20 are electronic, opto-electronic, optical, processing, electromechanical, or piezo-electric devices.

According to some embodiments, micro-device 20 has at least one of a micro-device length L that is greater than or equal to 200 μm and less than or equal to 2400 μm and a micro-device width W that is greater than or equal to 40 μm and less than or equal to 120 μm (or both). In some embodiments, micro-device length L is five to twenty times (or more) greater than micro-device width W. According to some embodiments of the present disclosure, micro-device length L is two to fifty times (or more) a length of hybrid tether 16 attached to micro-device 20. In some embodiments, micro-device length L is substantially ten times a greatest length of hybrid tether 16, where a length of a hybrid tether 16 and a micro-device 20 is taken in a direction orthogonal to micro-device width W (e.g., as shown in FIG. 1A).

In some embodiments, each micro-device 20 is disposed exclusively in direct contact with a sacrificial portion 12 of source substrate 10 so that, when sacrificial portion 12 is etched, the volume that was occupied by sacrificial portion 12 defines a gap 13 between micro-device 20 and source substrate 10 and micro-device 20 is suspended over gap 13 by one or more hybrid tethers 16 (e.g., as shown in FIGS. 4G and 4H and 6G and 6H). Thus, a material of sacrificial portion 12 is differentially or anisotropically etchable not only with respect to the remaining portion of source wafer 10 and anchors 18 but is also differentially or anisotropically etchable with respect to any or all of micro-device 20, a substrate of micro-device 20, or an encapsulating layer of micro-device 20. Micro-devices 20 can comprise a support layer or substrate, for example comprising a material relatively inert with respect to etchants of sacrificial portions 12, on which an active material is disposed for example a semiconductor or other structure. Micro-devices 20 can comprise semiconductor materials such as silicon or gallium or indium or compound semiconductor materials including such elements or other elements (e.g., III-V, II-VI, or both III-V and II-VI semiconductor compounds). In some embodiments, micro-devices 20 comprise an InP, GaN, or GaAs compound semiconductor (or a ternary compound thereof) with or without dopants.

As shown in FIGS. 6B-6I, micro-devices 20 can comprise structures such as electrically conductive contact pads 22 for making electrical contact to any one or more of micro-devices 20, doped semiconductor portions, wires, resistors, capacitors, or electrical or optical structures, or any combination of these, and any materials useful in such structures. Micro-devices 20 can comprise electrically insulating oxide or nitride layers (e.g., silicon dioxide or silicon nitride layers) that can also be differentially etchable with respect to sacrificial portions 12.

Hybrid tethers 16 are structures physically connecting each micro-device 20 to source substrate 10 through an anchor 18. Each micro-device 20 can be physically connected, for example laterally attached, by one or more, for example two or eight, hybrid tethers 16 to anchors 18. Hybrid tethers 16 can comprise materials that are part of an anchor 18, part of a micro-device 20, or can be other materials, including materials that permanently or temporarily encapsulate a micro-device 20. In some embodiments of the present disclosure, micro-devices 20 are laterally attached to anchors 18 and source substrate 10 only by hybrid tether(s) 16 after sacrificial portions 12 are etched to define gap 13 (e.g., such that etching defines hybrid tether 16). In some embodiments of the present disclosure, a desired ratio of a length of hybrid tether 16 along a side (e.g., a length) of a micro-device 20 can depend on a size of micro-device 20. In some embodiments of the present disclosure, a desired number of hybrid tethers 16 along a side of a micro-device 20 can depend on a size or a length of micro-device 20.

According to embodiments of the present disclosure, e.g., as illustrated in FIG. 1A, organic tether layer 40 is disposed on inorganic tether layer 30 on a side of inorganic tether layer 30 opposite source substrate 10 so that inorganic tether layer 30 is disposed between organic tether layer 40 and source substrate 10. A hybrid tether 16 can be a bi-layer hybrid tether 16 comprising only two layers or can comprise additional organic or inorganic layers, for example in a tri- or quad-layer arrangement. Inorganic and organic tether layers 30 and 40 can have any thickness or relative thicknesses but, according to some embodiments, organic tether layer 40 can be thicker than inorganic tether layer 30, for example organic tether layer 40 can be 1.5 to 15 times thicker than inorganic tether layer 30. Moreover, according to some embodiments, inorganic tether layer 30 can be no less than fifty nm thick and up to 5 μm thick when used alone. Organic tether layer 40 can be no less than one μm thick and no greater than five μm thick. In some embodiments, inorganic tether layer 30 is no less than fifty nm thick and no greater than one μm thick and organic tether layer 40 is no less than one μm thick and no greater than five μm thick. In some embodiments, inorganic tether layer 30 comprises any one or combination of silicon nitride, silicon dioxide, or amorphous silicon, organic tether layer 40 comprises positive photoresist (e.g., Microposit G2 S1828 from Dow Chemical Company or Megaposit SPR 220 from Rohm and Haas Company). For example, in some embodiments, inorganic tether layer 30 comprises silicon nitride and organic tether layer 40 comprises S1828 photoresist. In some embodiments, inorganic tether layer 30 has a thickness in the range of 50 nm to 500 nm, for example 150 nm to 200 nm or 200 nm to 250 nm. In some embodiments, organic tether layer 40 has a thickness in the range of 500 nm to 6 µm, for example 1 µm to 4 µm or 2 µm to 3 µm.

In some embodiments of the present disclosure, inorganic tether layer 30 extends over at least a first portion of a micro-device 20, organic tether layer 40 extends over at least a second portion of a micro-device 20, or inorganic tether layer 30 extends over at least a first portion of a micro-device 20 and organic tether layer 40 extends over at least a second portion of micro-device 20. The first and second portions can be the same portion or different portions. In some embodiments, inorganic tether layer 30, organic tether layer 40, or both inorganic tether layer 30 and organic tether layer 40 encapsulate a micro-device 20. An encapsulation layer can protect a micro-device 20 (e.g., the process side thereof, other portion thereof, or the entirety thereof) from the environment, for example from photolithographic processing gases or liquids or from environmental gases such as air, oxygen, nitrogen, and ozone, environmental liquids such as water, or particulate contamination such as dust or other airborne particles. As shown in FIG. 2, in some embodiments in which micro-devices 20 each comprise one or more contact pads 22, inorganic tether layer 30 can encapsulate micro-devices 20 except for one or more contact pads 22 and organic tether layer 40 can encapsulate micro-device 20 including one or more contact pads 22.

As shown in FIG. 2, in some embodiments of a micro-device structure 99, micro-device 20 is disposed in a micro-device layer 24 over source wafer 10 and hybrid tether 16 comprises a tether device portion 16D disposed at least partly on or over micro-device 20, a tether anchor portion 16A disposed at least partly on or over anchor 18, and a tether connection portion 16C connecting tether device portion 16D to tether anchor portion 16A. Tether connection portion 16C can be at least partially in direct contact with sacrificial portion 12. Hybrid tether 16 can be physically continuous and hybrid tether 16 can be disposed at least partly in micro-device layer 24 laterally between micro-device 20 and anchor 18. Thus, hybrid tether 16 can be or comprise the physical connection between micro-device 20 and anchor 18 (e.g., as shown in FIG. 1B) or can comprise portions disposed on or over anchor 18 and on or over micro-device 20 (e.g., tether anchor portion 16A, tether connection portion 16C, and tether device portion 16D (e.g., as shown in FIG. 2) Thus, according to some embodiments, tether device portion 16D and tether anchor portion 16A are at least partly disposed in a layer 28 farther from source substrate 10 than tether connection portion 16C in a layer 26.

Figure 3:
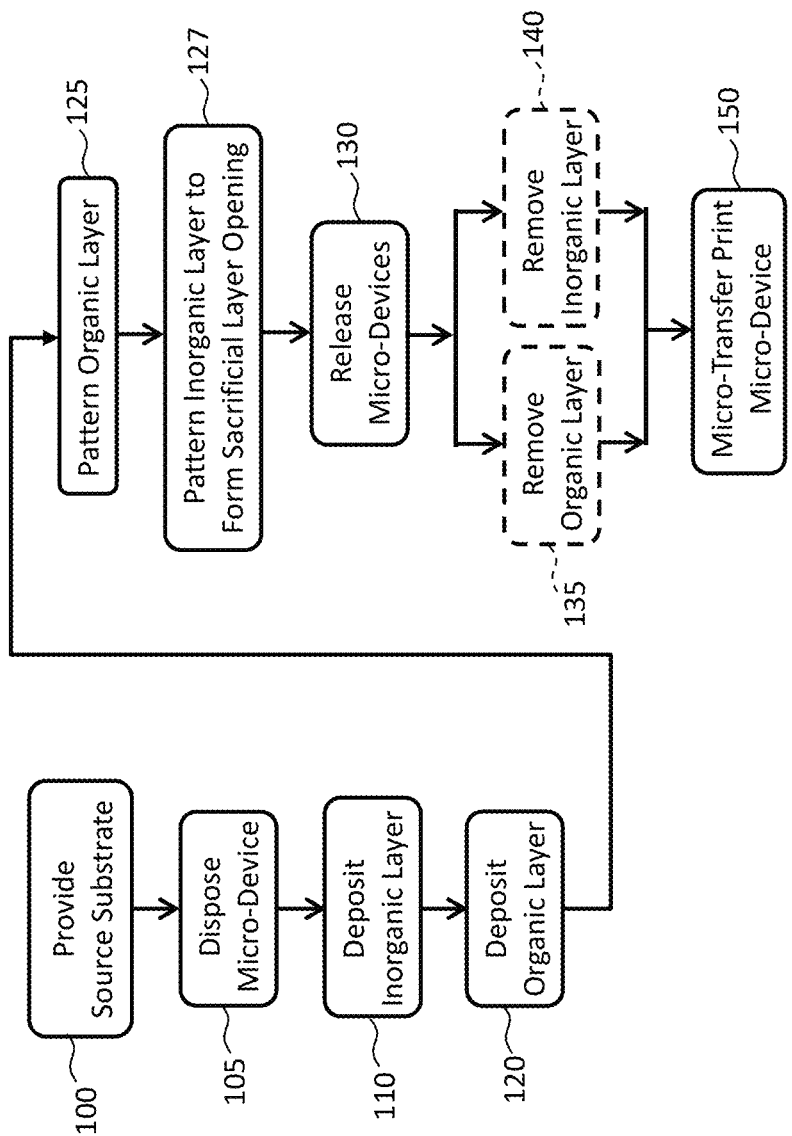
FIG. 3 is a flow diagram of exemplary methods according to illustrative embodiments of the present disclosure.

In some embodiments and as shown in the FIG. 3 flow diagram and the corresponding successive cross sections of FIGS. 4A-4L, a method of making a micro-device structure 99 comprises providing a source substrate 10 comprising an insulating layer 21 on source substrate 10 and an epitaxial layer 24 on insulating layer 21 in step 100. As shown for example in FIG. 4B, in step 105 a micro-device 20 is disposed (e.g., formed using photolithographic processes) in epitaxial layer 24 (so that epitaxial layer 24 is also a micro-device layer 24) and insulating layer 21 is patterned so that each micro-device 20 is disposed exclusively on insulating layer 21 and none of micro-devices 20 are disposed over or in contact with other portions of source substrate 10. Micro-devices 20 can be formed on and native to a process side of source substrate 10 using photolithographic methods and materials found in semiconductor fabrication facilities such as integrated circuit foundries and can be, for example, electronic or opto-electronic integrated circuits, such as micro-lasers (e.g., micro-diode lasers).

Figure 4A:
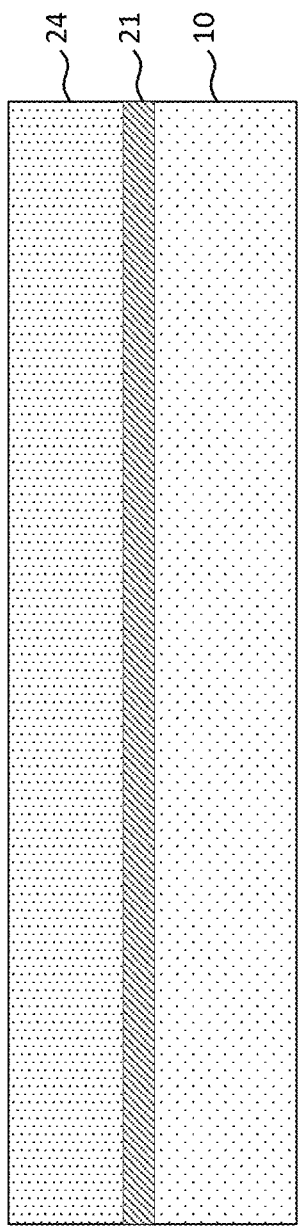
Figure 4B:
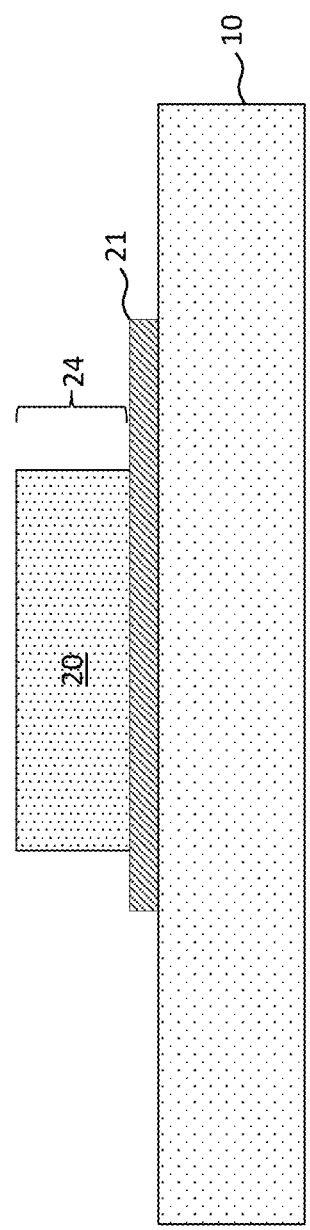
Figure 4C:
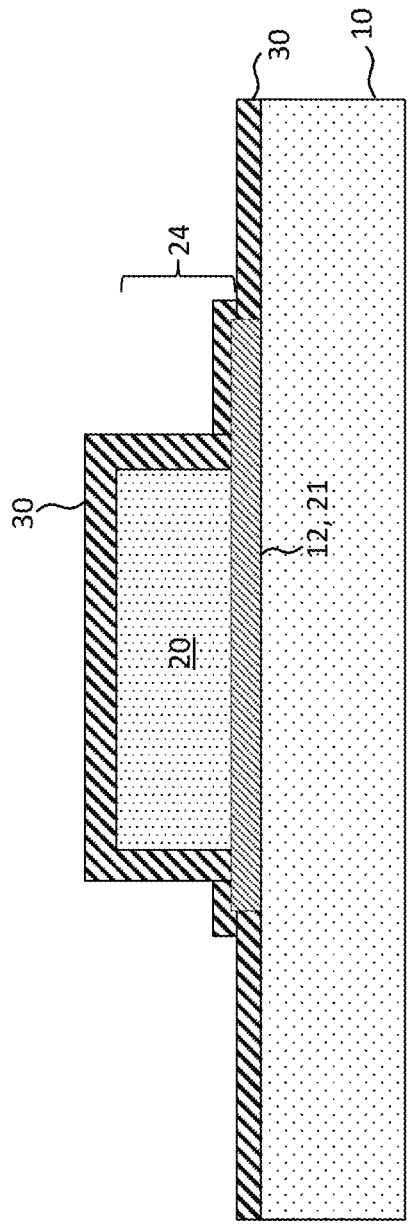

As shown for example in FIG. 4C, in step 110 inorganic tether layer 30 material is disposed over at least a portion of micro-devices 20 (e.g., all of micro-devices 20), source substrate 10, and exposed portions of insulating layer 21 using an inorganic material deposition method. Deposition of inorganic tether layer 30 material can be a blanket (unpatterned) deposition, for example a deposition method such as sputtering, evaporation, or a continuous, single-frequency plasma-enhanced chemical vapor deposition (PECVD). Inorganic tether layer 30 can be patterned.

Figure 4D:
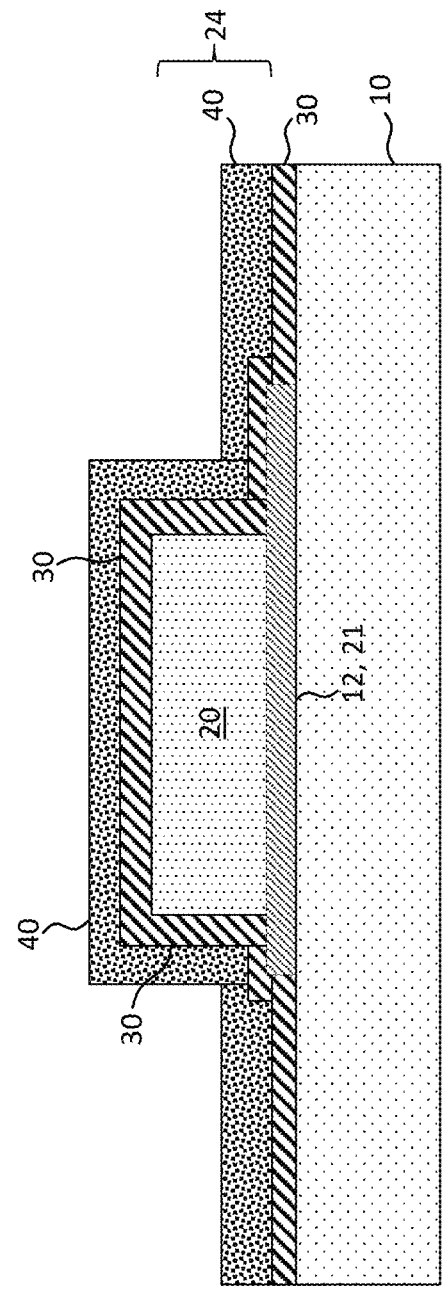
Figure 4E:
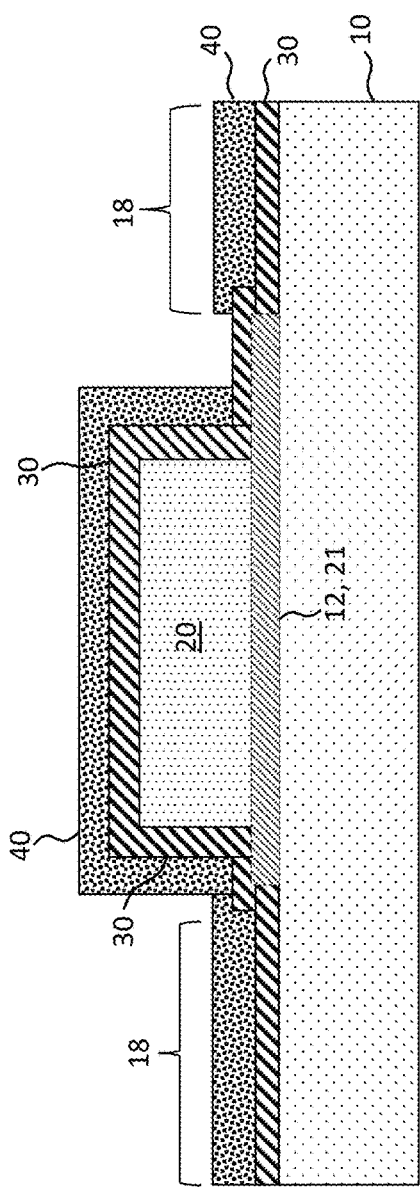
Figure 4F:
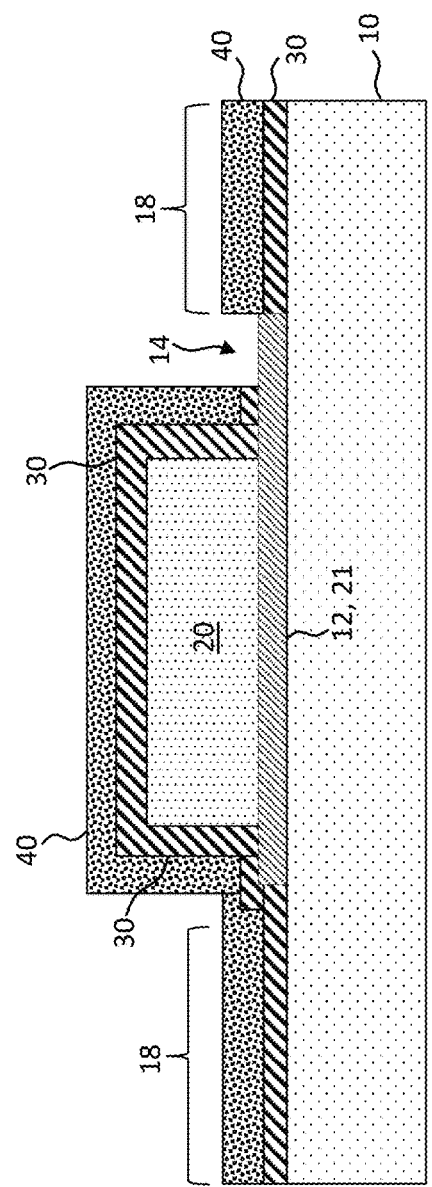

In step 120, and as shown for example in FIG. 4D, organic tether layer 40 is deposited over inorganic tether layer 30 using a second deposition method, for example an organic material deposition method such as spin coating, spray coating, curtain coating, evaporation, or other known organic material deposition methods. Deposition of organic tether layer 40 can be a blanket (unpatterned) deposition and can employ a deposition method that has at least some different attributes from the deposition method of inorganic tether layer 30. In step 125 and as shown for example in FIG. 4E, organic tether layer 40 is patterned exposing a portion of inorganic layer 30. In step 127 and as shown for example in FIG. 4F, inorganic tether layer 30 is patterned to form opening 14 exposing insulating layer 21 (sacrificial portion 12).

Figure 4G:
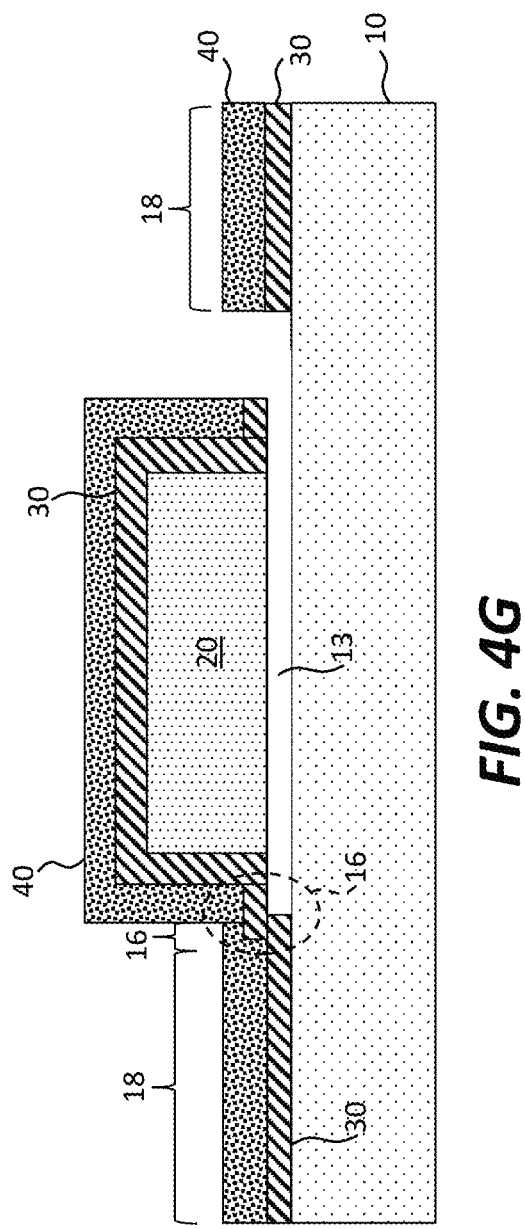

In step 130, and as shown for example in FIG. 4G, sacrificial portion 12 is etched, for example by introducing an etchant into an opening 14, to release micro-devices 20 from a source substrate 10 so that micro-devices 20 are suspended over gaps 13 (and thus over recessed portions of source substrate 10), are separated from source substrate 10, and are attached to anchors 18 and source wafer 10 with hybrid tethers 16 (e.g., with only hybrid tethers 16). Thus, a released micro-device 20 is physically connected to source substrate 10 only with hybrid tether(s) 16. The etchant selectively etches each sacrificial portion 12 while leaving micro-devices 20 and the remainder of the source substrate 10 substantially undisturbed (e.g., functionally undisturbed). In some embodiments and as shown for example in FIG. 1A, after etching sacrificial portions 12 and releasing micro-device 20, a micro-device 20 is physically connected to one or more anchors 18 with one or more hybrid tethers 16 and suspended over source wafer 10, and each of one or more hybrid tethers 16 connects micro-device 20 to one or more anchors 18. Micro-device structure 99 can comprise additional tethers that are or are not hybrid tethers 16. The sacrificial portion 12 etching in step 130 can mechanically perturb micro-devices 20 so that hybrid tether(s) 16 having sufficient strength and flexibility can maintain the location and position of micro-device 20 with respect to source wafer 10, enabling accurate and precise micro-printing transfer of micro-device 20.

According to some embodiments of the present disclosure, hybrid tether 16 is optionally processed in step 135 to form a tether comprising only an inorganic tether layer 30 by removing organic tether layer 40 either before etching sacrificial portion 12 in step 130 (not shown in FIG. 3) or after etching sacrificial portion 12 in step 130 (as shown in FIG. 3) and as shown in FIG. 1D. By removing organic tether layer 40 in step 135 after etching sacrificial portion 12 in step 130, organic tether layer 40 can provide protection to micro-device 20 during etching step 130. Such a tether comprising only an inorganic tether layer 30 can fracture more readily when picked up by a stamp 50.

According to some embodiments of the present disclosure, hybrid tether 16 is optionally processed to form a tether comprising only an organic tether layer 40 by removing inorganic tether layer 30 after etching sacrificial portion 12 in step 140 and as shown in FIG. 1E, for example by preferentially etching inorganic tether layer 30 relative to organic tether layer 40 and, optionally, source substrate 10. A tether comprising only an organic tether layer 40 can have increased flexibility and create fewer contaminating particles.

In some embodiments and as shown in FIG. 3, insulating layer 21 can be differentially etchable from inorganic tether layer 30, organic tether layer 40, and micro-device 20 (epitaxial layer 24), e.g., comprising a dielectric material where inorganic tether layer is SiN, organic tether layer 40 is a photoresist, and micro-device 20 comprises a crystalline semiconductor such as silicon or a compound semiconductor such as GaN, InP, or GaAs.

Figure 4I:
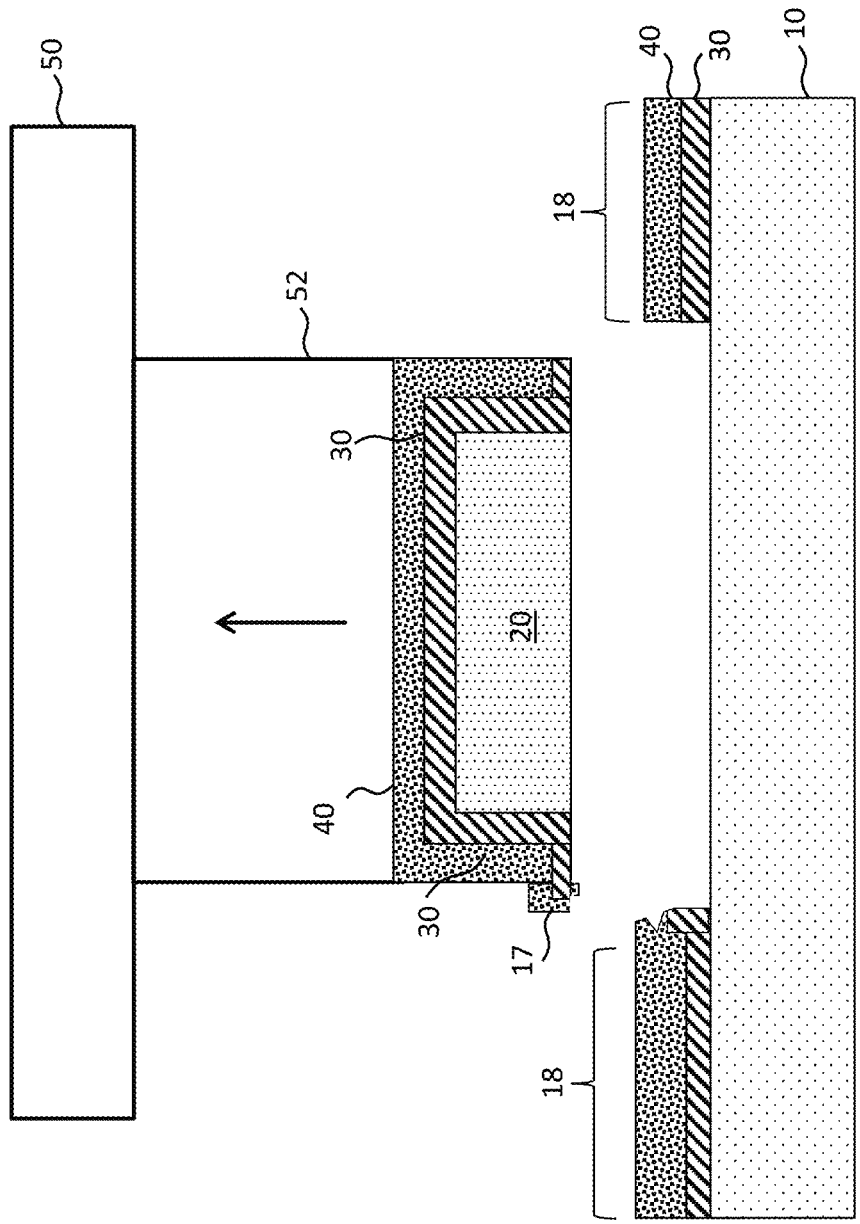
Figure 4J:
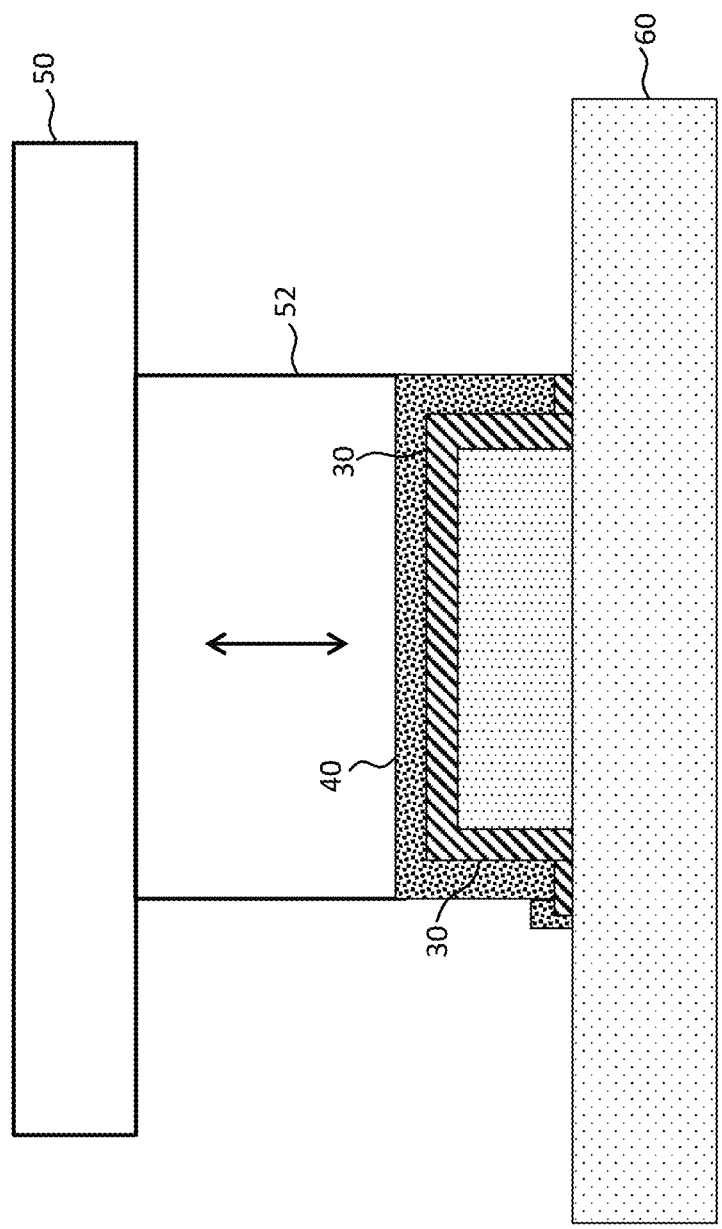
Figure 8A:
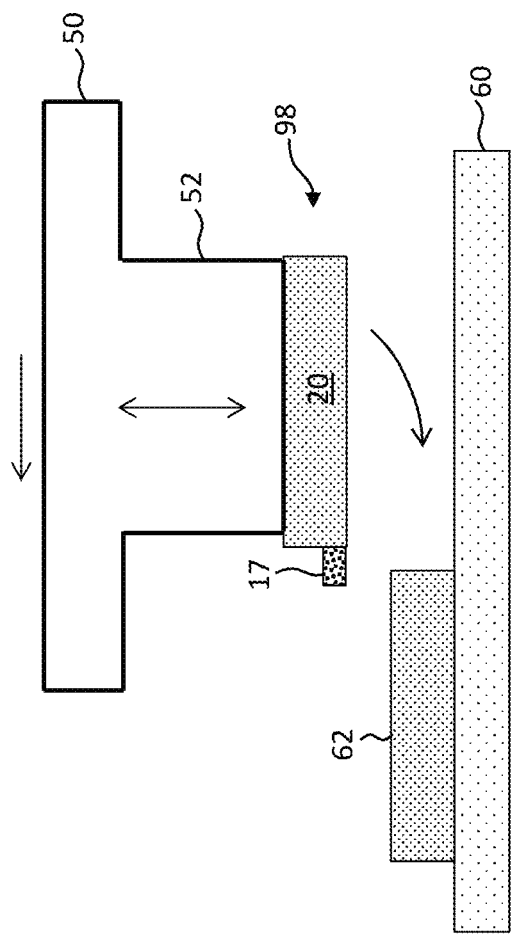
FIGS. 8A and 8B are schematic cross sections illustrating micro-transfer printing a micro-device in close proximity to a target substrate alignment structure according to illustrative embodiments of the present disclosure.
Figure 8B:
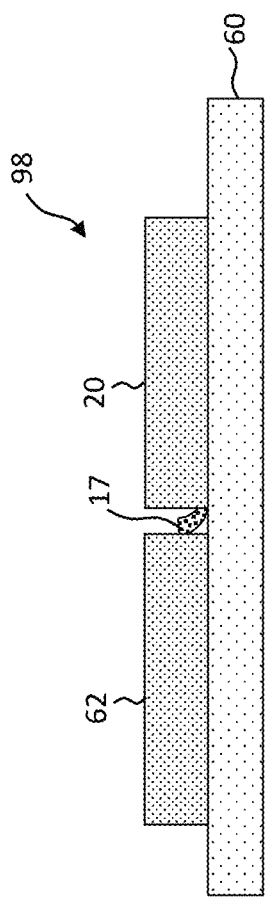

As illustrated for example in FIGS. 4H-4J, micro-devices 20 can be micro-transfer printed in step 150 by contacting each micro-device 20 with a respective stamp post 52 of a transfer stamp 50 to adhere micro-devices 20 to stamp posts 52 (e.g., as shown in FIG. 4H) and then removing the transfer stamp 50 from source wafer 10, thereby fracturing hybrid tethers 16 (e,g., as shown in FIG. 4I). Portions of hybrid tethers 16 (e.g., flaps 17) can remain attached to micro-device 20. As shown for example in FIG. 4J, stamp 50 is then relocated to a target (destination) substrate 60, micro-devices 20 are pressed against target substrate 60 to adhere micro-devices 20 to target substrate 60, and stamp 50 is removed from micro-devices 20 and target substrate 60, leaving micro-devices 20 disposed on target substrate 60. Target substrate 60 can comprise an adhesive layer or alignment structures 62 (e.g., as shown in FIGS. 8A and 8B) to assist in adhering micro-devices 20 to target substrate 60 at a desired location and with a desired proximity to alignment structures 62. After micro-devices 20 are adhered to the adhesive layer, the adhesive layer can be cured to permanently affix micro-devices 20 to target substrate 60. Alignment structures 62 can be solely for the purpose of disposing micro-devices 20 exactly where desired or alignment structures 62 can be functional structures, such as other micro-devices 20 or photonic structures such as light pipes, optical sensors, or lasers.

Figure 5:
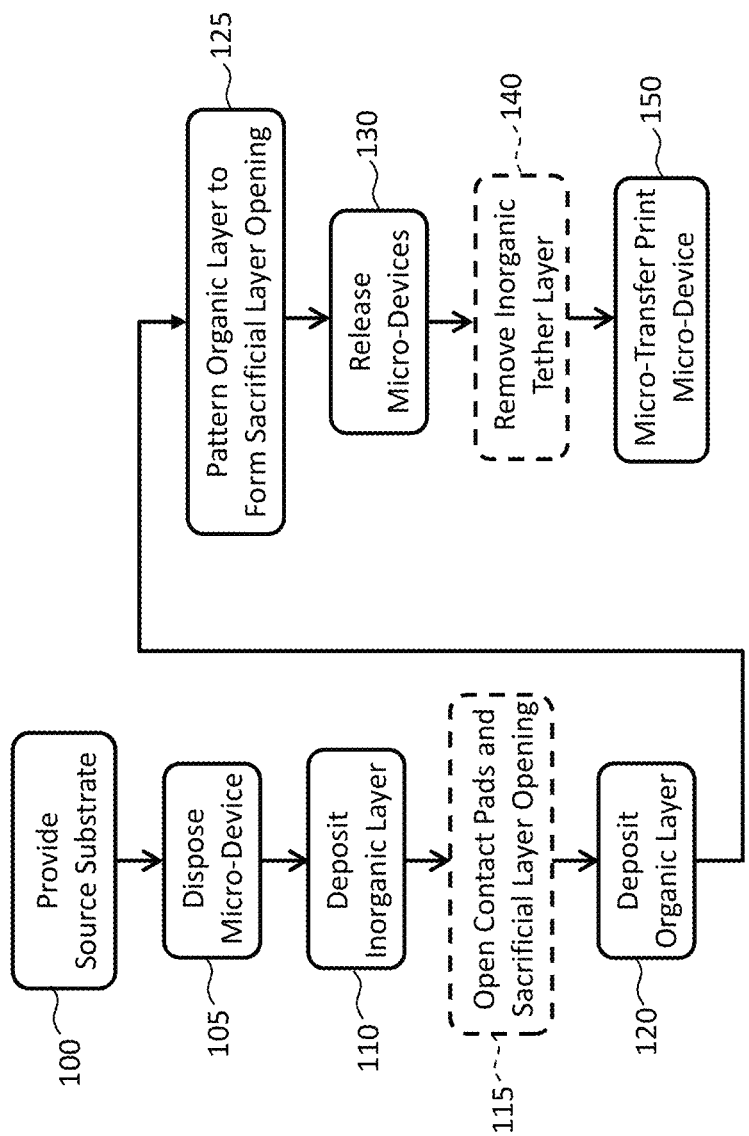
FIG. 5 is a flow diagram of exemplary methods according to illustrative embodiments of the present disclosure.
Figure 6A:
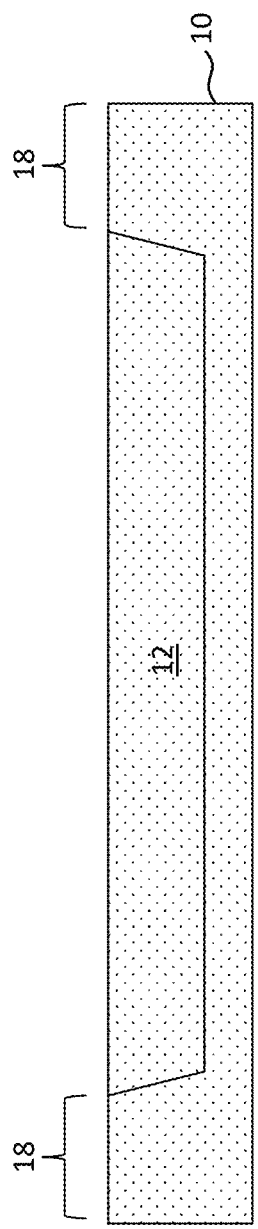
FIGS. 6A-6I are successive cross sections illustrating exemplary methods and micro-device structures according to illustrative embodiments of the present disclosure.
Figure 6B:
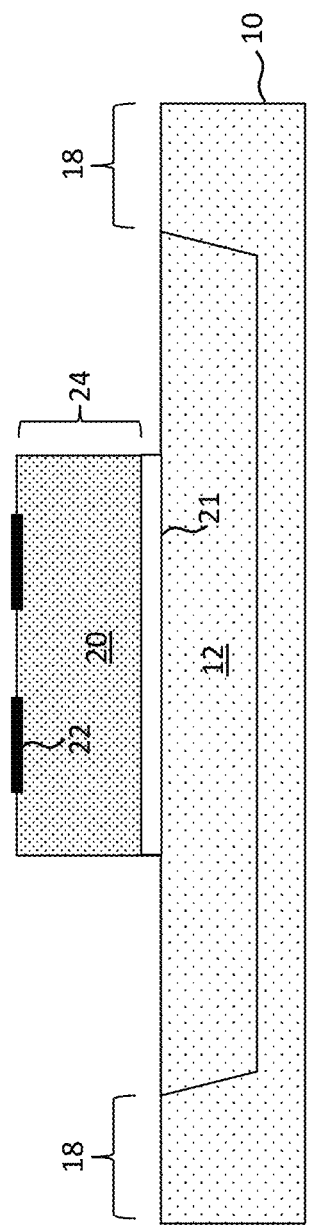

Referring to the FIG. 5 flow diagram and the corresponding successive cross sections of FIGS. 6A-6I, a method of making a micro-device structure 99 comprises providing a source substrate 10 comprising sacrificial portions 12 laterally spaced apart by anchors 18 in step 100 and, for example, as shown in FIG. 6A. As shown for example in FIG. 6B, in step 105 a micro-device 20 is disposed in association with source substrate 10 on, in or over each sacrificial portion 12, for example by photolithographic processing of a patterned epitaxial layer 24. Micro-device 20 can have or be disposed on an insulating layer 21. Thus, source substrate 10, insulating layer 21, and micro-device 20 (formed in epitaxial layer 24) can be a semiconductor-on-wafer structure (as also shown in FIG. 4A). In the embodiments of FIGS. 6A-6I and as discussed below, sacrificial portion 12 is a portion of source substrate 10 (rather than a portion of insulating layer 21 as in the embodiments of FIGS. 4A-4J) and therefore uses a different processing methodology, materials, and etchants that can be useful for some applications. Each micro-device 20 can be located exclusively on (e.g., in direct contact with) (e.g., entirely and exclusively over) a sacrificial portion 12 so that each micro-device 20 is disposed exclusively on one of sacrificial portions 12 and none of micro-devices 20 are disposed over or in contact with anchors 18 or other portions of source substrate 10. Micro-devices 20 can comprise a contact pad 22 for making electrical contact to each micro-device 20 to operate micro-device 20. Micro-devices 20 can be formed on and native to a process side of source substrate 10 using photolithographic methods and materials found in semiconductor fabrication facilities such as integrated circuit foundries and can be, for example, electronic or opto-electronic integrated circuits, such as micro-lasers.

Figure 6C:
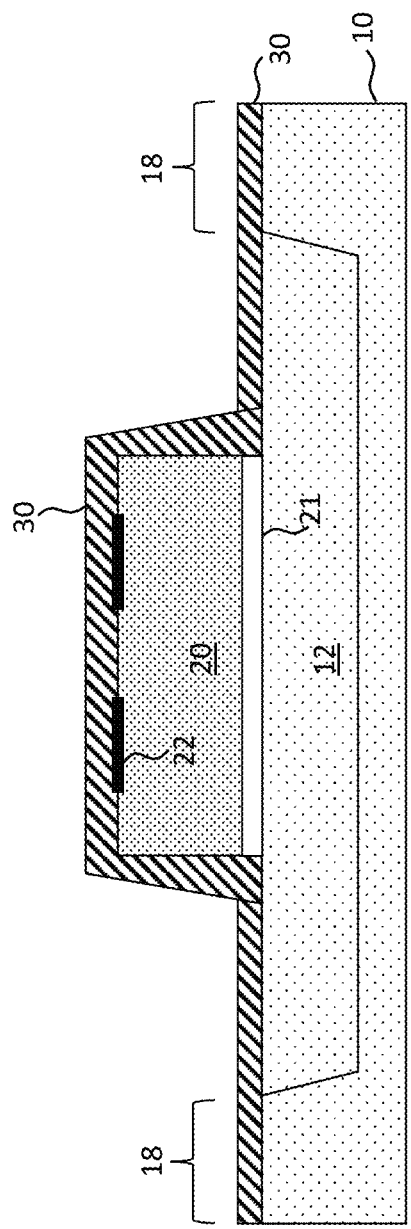
Figure 6D:
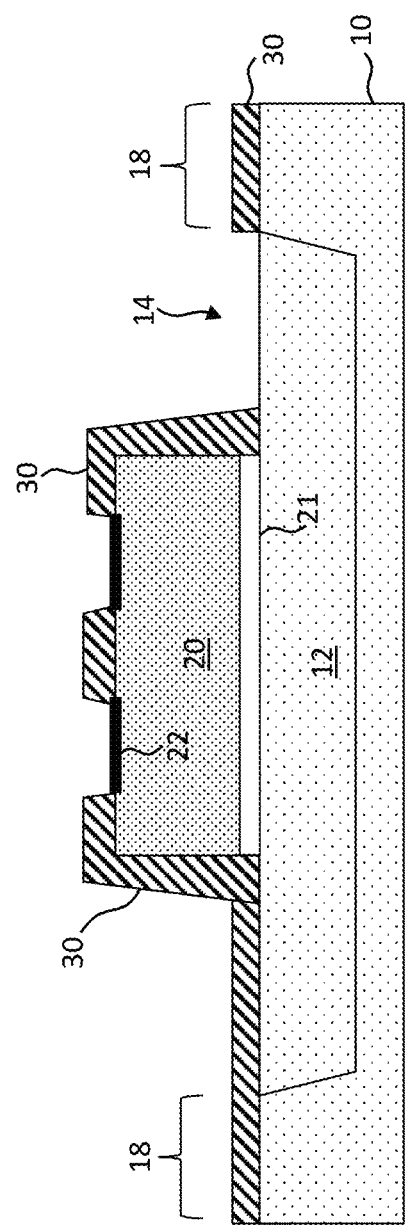

As shown for example in FIG. 6C, in step 110 inorganic tether layer 30 material is disposed over at least a portion of anchors 18 and micro-devices 20 and a source substrate 10 using an inorganic material deposition method. Where sacrificial portions 12 are exposed (not covered by a micro-device 20), inorganic tether layer 30 material covers the exposed parts of sacrificial portions 12. Deposition of inorganic tether layer 30 material can be a blanket (unpatterned) deposition, for example a deposition method such as sputtering, evaporation, or a continuous, single-frequency plasma-enhanced chemical vapor deposition (PECVD). As shown for example in FIG. 6D, in optional step 115 inorganic tether layer 30 material is patterned, for example by using photolithographic processes, masks, and etchants to remove portions of inorganic tether layer 30 material, to expose contact pads 22, to form an opening 14 to sacrificial portion 12, and to form inorganic tether layer 30 of hybrid tether 16 physically connecting micro-device 20 to anchor 18.

Figure 6E:
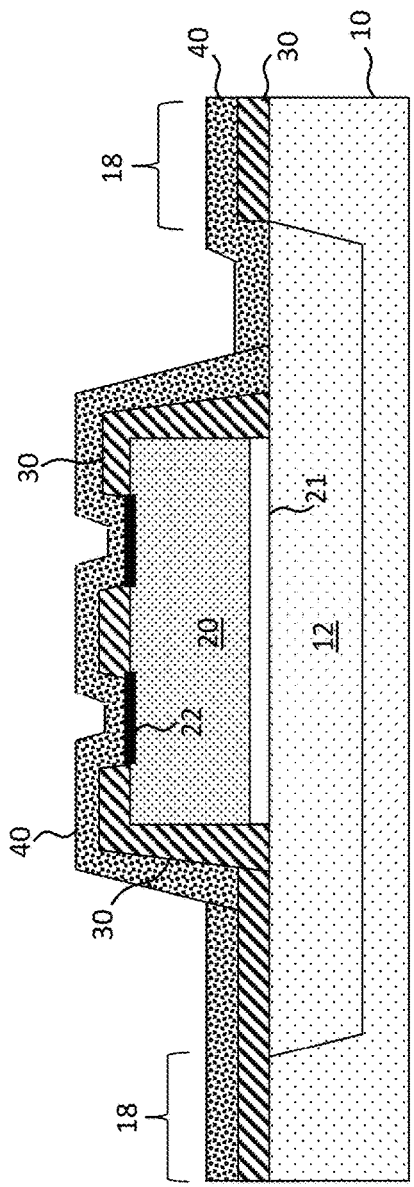
Figure 6F:
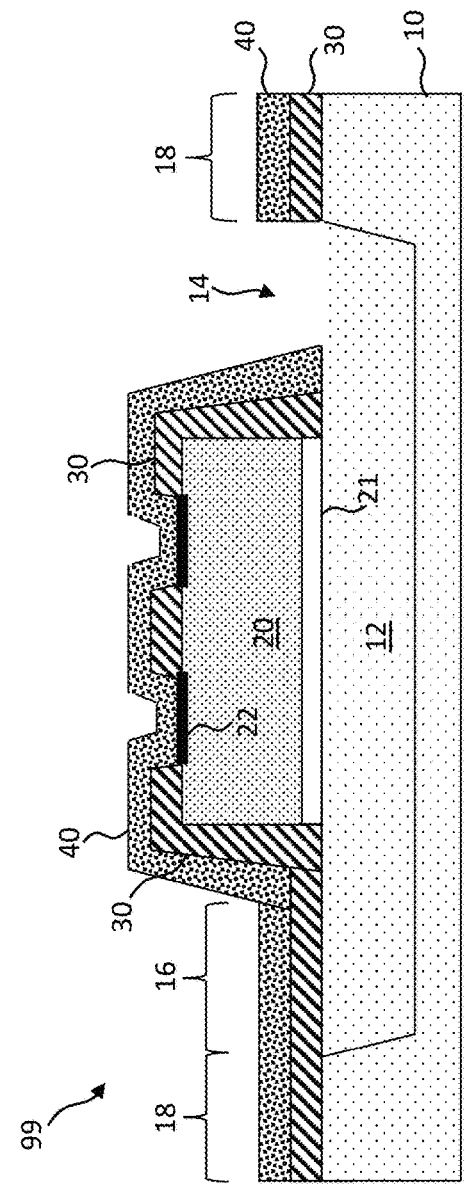

In step 120, and as shown for example in FIG. 6E, organic tether layer 40 is deposited over inorganic tether layer 30 using a second deposition method, for example an organic material deposition method such as evaporation, spin coating, spray coating, curtain coating, or other known organic material deposition methods. Deposition of organic tether layer 40 can be a blanket (unpatterned) deposition and can employ a deposition method that has at least some different attributes from the deposition method of inorganic tether layer 30, thus forming a hybrid tether 16 for each micro-device 20 such that hybrid tether 16 laterally attaches each micro-device 20 to an anchor 18. In step 125 and as shown for example in FIG. 6F, inorganic tether layer 30 is patterned to re-form opening 14 exposing each sacrificial portion 12 and, optionally, open contact pads 22 (not shown in FIG. 6F).

Figure 6G:
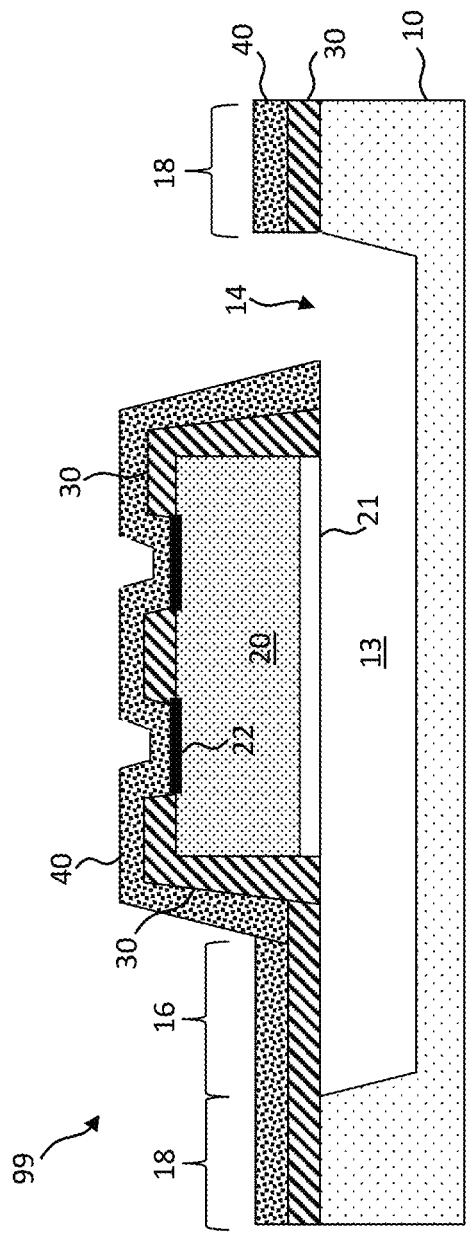

In step 130, and as shown for example in FIG. 6G, sacrificial portions 12 are etched, for example by introducing an etchant into opening 14, to release micro-devices 20 from source substrate 10 so that micro-devices 20 are suspended over gaps 13 (and thus over recessed portions of source substrate 10), are separated from source substrate 10, and are attached to anchors 18 and source wafer 10 with hybrid tethers 16 (e.g., with only hybrid tethers 16). The etchant selectively etches each sacrificial portion 12 while leaving micro-devices 20, insulating layer 21, and the remainder of the source substrate 10 (e.g., anchors 18) substantially undisturbed (e.g., functionally undisturbed). In some embodiments and as shown for example in FIG. 1A, after etching sacrificial portions 12, a micro-device 20 is physically connected to one or more anchors 18 with one or more hybrid tethers 16 and suspended over source wafer 10, and each of one or more hybrid tethers 16 connects micro-device 20 to one or more anchors 18. Micro-device structure 99 can comprise additional tethers that are not hybrid tethers 16. The sacrificial portion 12 etching in step 130 can mechanically perturb micro-devices 20 so that hybrid tether(s) 16 having sufficient strength and flexibility can maintain the location and position of micro-device 20 with respect to source wafer 10, enabling accurate and precise micro-printing transfer of micro-device 20.

In the embodiments of FIG. 5, sacrificial portions 12 can be differentially etchable from inorganic tether layer 30, organic tether layer 40, and insulating layer 21 (or micro-device 20), e.g., comprising an anisotropically etchable crystalline silicon material where inorganic tether layer 30 is SiN, organic tether layer 40 is a (e.g., positive) photoresist, insulating layer 21 comprises silicon dioxide, and micro-device 20 and source substrate 10 each comprise a crystalline semiconductor such as silicon.

Figure 6H:
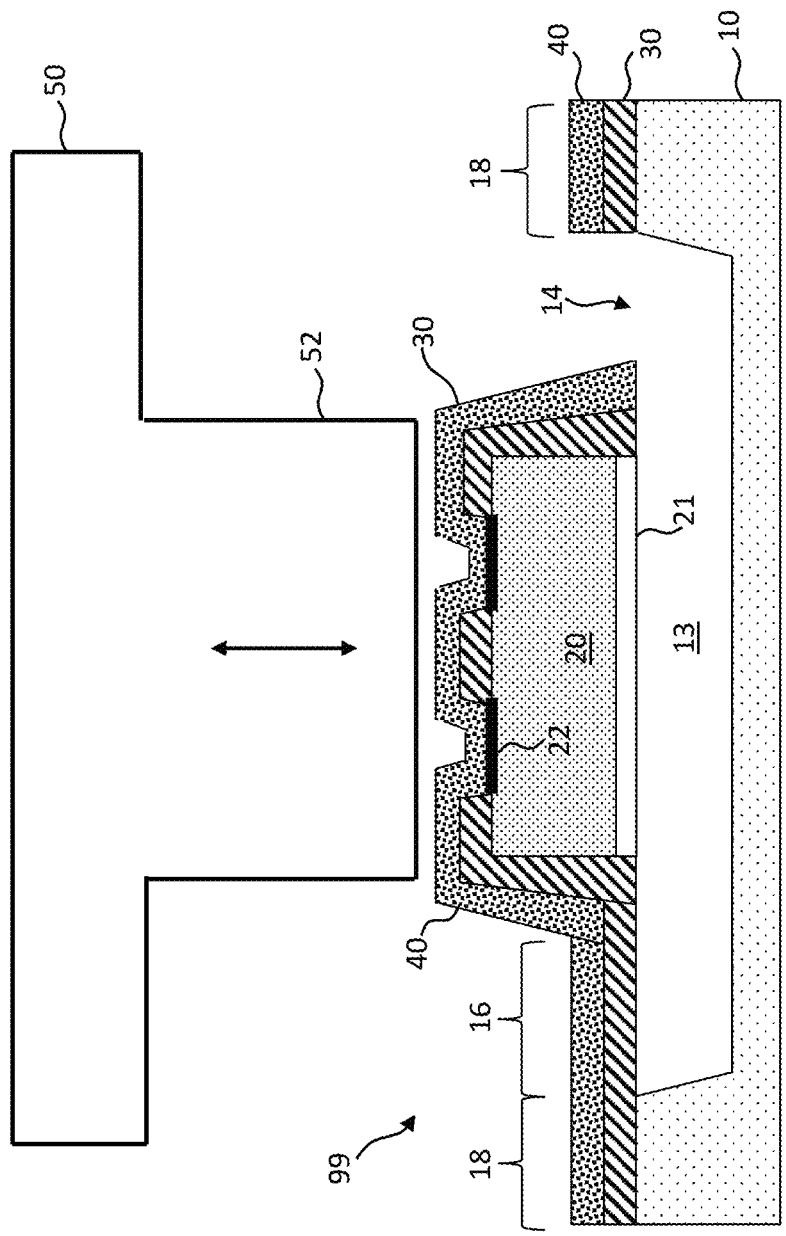
Figure 6I:
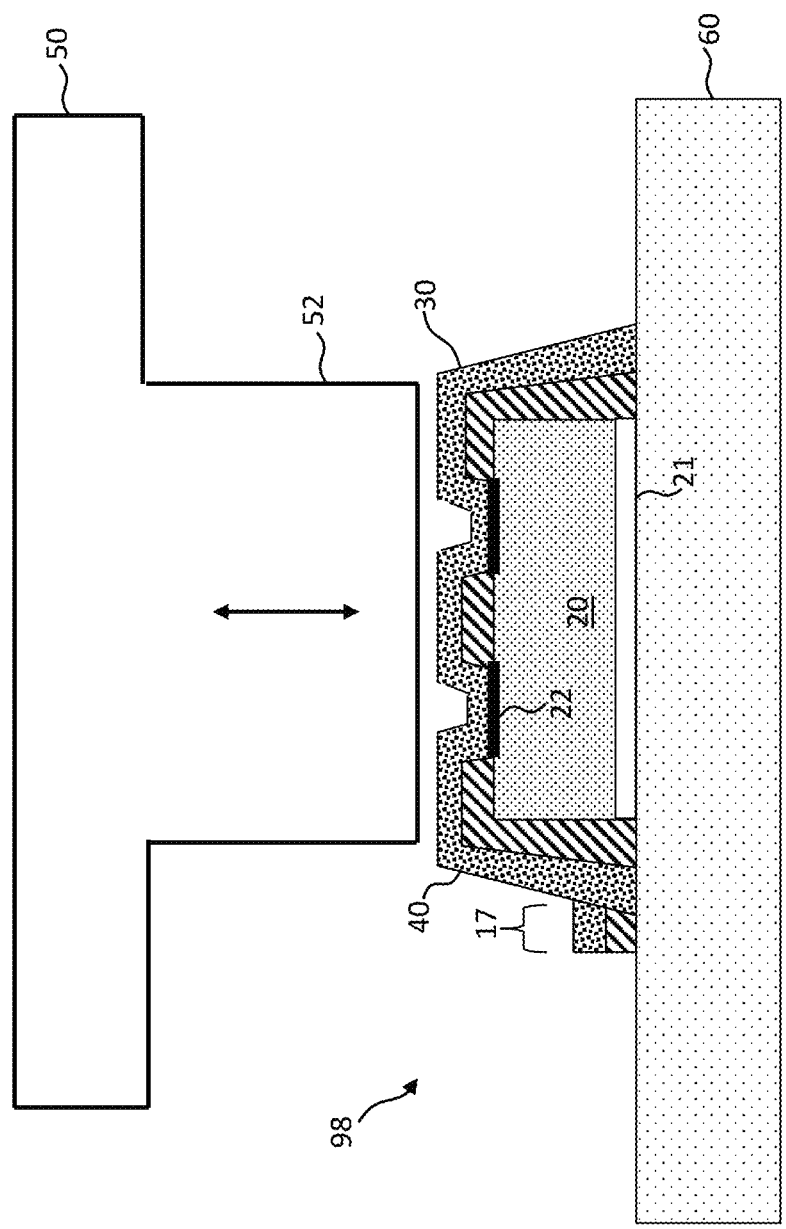

As illustrated for example in FIGS. 6H and 6I, micro-devices 20 can be micro-transfer printed in step 150 by contacting each micro-device 20 with a respective stamp post 52 of a transfer stamp 50 to adhere micro-devices 20 to stamp posts 52 and then removing the transfer stamp 50 from source wafer 10, thereby fracturing hybrid tethers 16 (e,g., as shown in FIG. 6H). As shown for example in FIG. 6I, stamp 50 is then relocated to a target (destination) substrate 60, micro-devices 20 are pressed against target substrate 60 to adhere micro-devices 20 to target substrate 60, and stamp 50 is removed from micro-devices 20 and target substrate 60, leaving micro-devices 20 disposed (printed) on target substrate 60. Target substrate 60 can comprise an adhesive layer or alignment structures 62 (e.g., as shown in FIGS. 8A and 8B) to assist in adhering micro-devices 20 to target substrate 60 at a desired location and with a desired proximity to alignment structures 62. After micro-devices 20 are adhered to the adhesive layer, the adhesive layer can be cured to permanently affix micro-devices 20 to target substrate 60. Alignment structures 62 can be solely for the purpose of disposing micro-devices 20 exactly where desired or alignment structures 62 can be functional structures, such as other micro-devices 20 or photonic structures such as light pipes, optical sensors, or lasers.

Once micro-devices 20 are separated from source substrate 10, in embodiments of the present disclosure, a micro-device structure 98 can comprise a micro-device 20 and at least a portion of a hybrid tether 16 (e.g., a fractured hybrid tether 16, such as a flap 17) connected to micro-device 20. Hybrid tether 16 or flap 17 can comprise organic tether layer 40 and inorganic tether layer 30. Micro-device structure 98 can also comprise a target substrate 60 to which micro-device 20 is adhered, either with or without an adhesive layer.

Figure 7A:
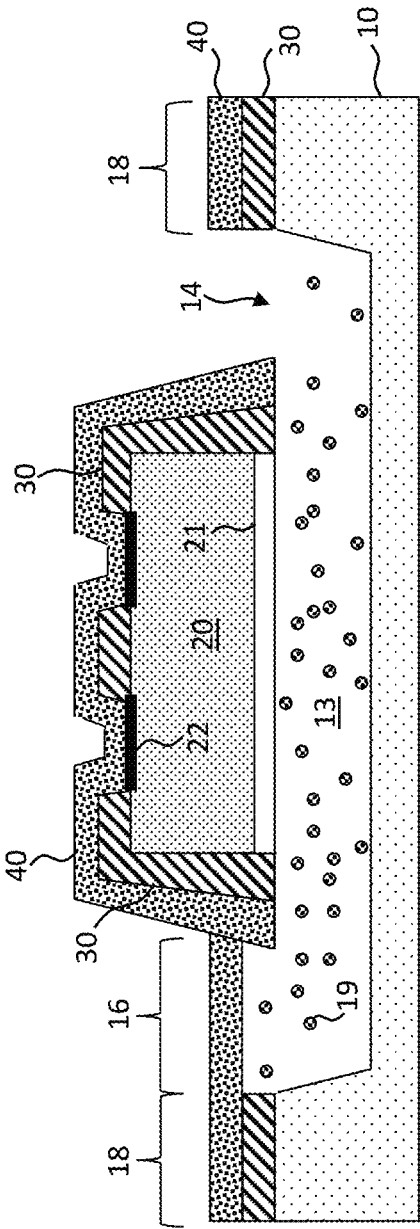
FIGS. 7A and 7B are schematic cross sections illustrating exemplary micro-device structures according to illustrative embodiments of the present disclosure.

According to some embodiments and as illustrated for example in FIG. 7A (corresponding to FIG. 1E), an inorganic tether layer etchant 19 (e.g., a gaseous etchant such as an isotropic dry etch) can be introduced into gap 13 (or other process step such as ashing performed) to remove inorganic tether layer 30 in optional step 140. By removing inorganic tether layer 30, contaminating particle formation can be reduced when fracturing organic tether layer 40 and any flaps 17 remaining that are attached to micro-device 20 are rendered even more flexible, facilitating micro-transfer printing micro-device 20 on a target substrate 60 adjacent to, in contact with, or in close proximity to an alignment structure 62 on target substrate 60 or another micro-device 20 disposed on target substrate 60.

Figure 7B:
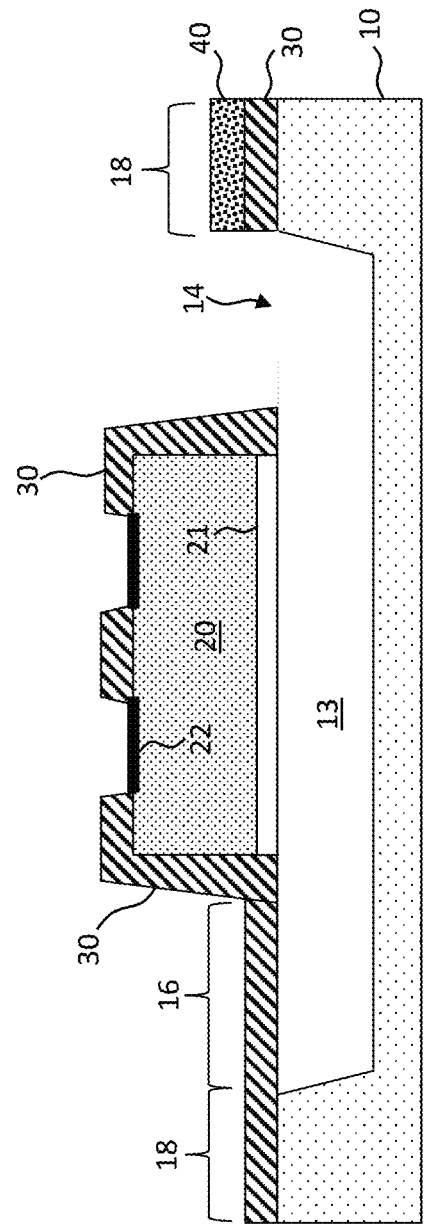

According to some embodiments and as illustrated for example in FIG. 7B (corresponding to FIG. 1D), organic tether layer 40 can be removed (e.g., corresponding to optional step 135 of FIG. 3) either before etching step 130 or after etching step 130 (as shown in FIG. 7B). In some embodiments of the present disclosure, organic tether layer 40 is removed after micro-device 20 is disposed on target substrate 60 (e.g., after step 150 of FIGS. 4J or 6I).

As shown for example in FIGS. 8A and 8B, micro-devices 20 can be micro-transfer printed to target substrate 60 using vertical or horizontal and vertical stamp 50 motion to closely align micro-devices 20 with an alignment structure 62 or other micro-device 20 disposed on target substrate 60, for example as disclosed in U.S. Pat. No. 10,714,374. Hybrid tethers 16 of micro-devices 20 can be smaller and more flexible than other tether designs so that hybrid tethers 16 do not interfere with or prevent micro-devices 20 from contacting or closely aligning with alignment structures 62 or other micro-device 20 disposed on target substrate 60. For example, hybrid tethers 16 can extend only a few microns from micro-device 20 or can bend away from alignment structures or other micro-device 20 disposed on target substrate 60. In some embodiments, hybrid tethers 16 are largely absent from micro-transfer printed micro-devices because, when stamps 50 remove micro-devices 20 with hybrid tethers 16 from source wafers 10, hybrid tethers 16 fracture at a point directly in contact with micro-devices 20 on inorganic tether layer 30, while organic tether layer 40 is left with a small flap 17 less than 5 μm long.

FIG. 8A illustrates a stamp 50 with a micro-device 20 on a stamp post 52 micro-transfer printing micro-device 20 onto target substrate 60 in close proximity to alignment structure 62 by moving micro-device 20 in both a horizontal direction over target substrate 60 and in a vertical direction toward target substrate 60. FIG. 8B illustrates a micro-transfer-printed micro-device 20 disposed on target substrate 60 with a bent flap 17 of hybrid tether 16 between micro-device 20 and alignment structure 62 so that micro-device 20 can be disposed closer to alignment structure 62 than would otherwise be the case. Furthermore, a more flexible hybrid tether 16 can print to target substrate 60 with an improved print yield as hybrid tethers 16 are less of an obstacle to target substrate 60 or any structures or micro-devices 20 on target substrate 60.

Figure 9:
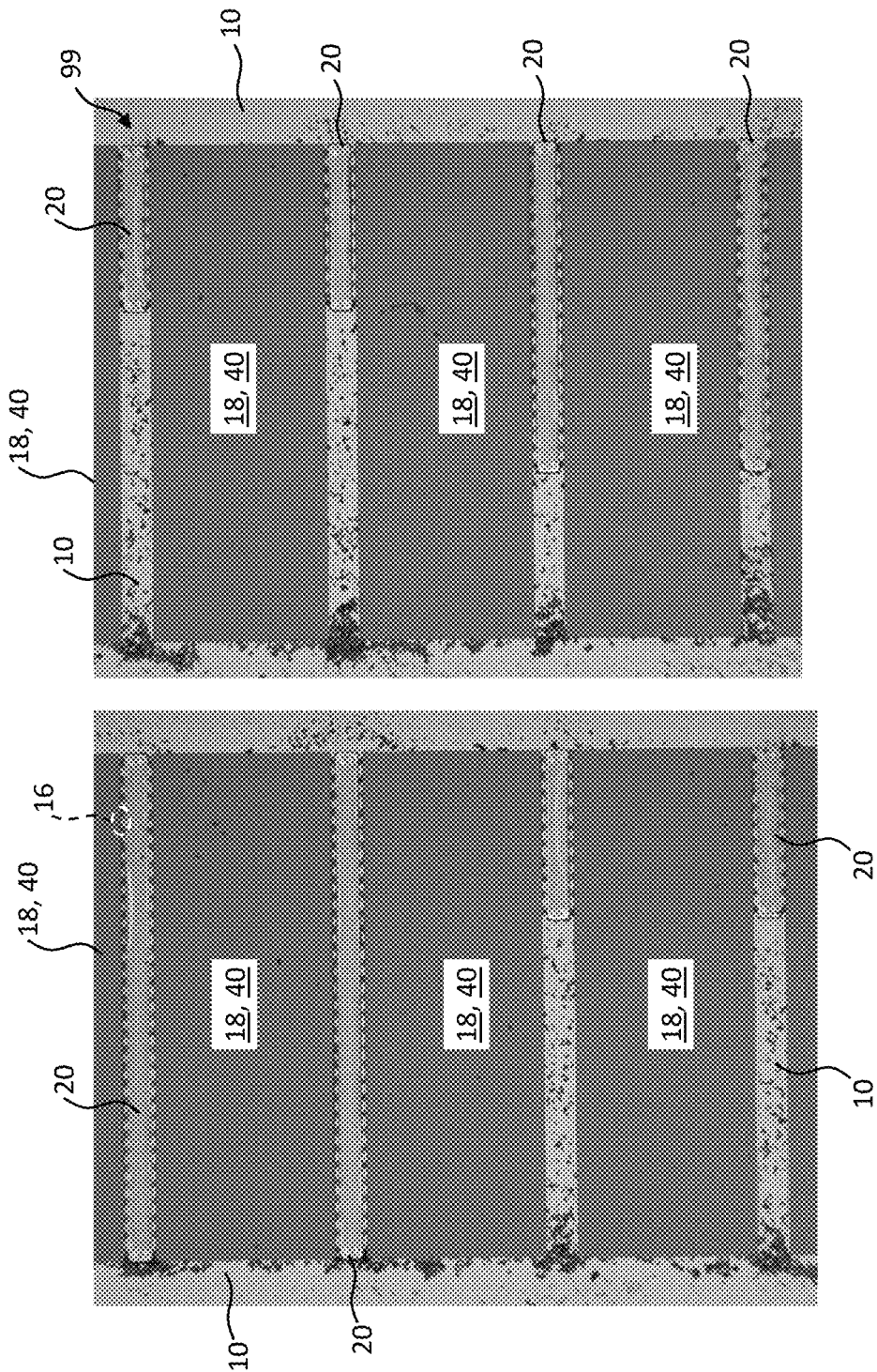
FIG. 9 is a micrograph of a source wafer with micro-devices according to illustrative embodiments of the present disclosure.

FIG. 9 shows two micro-graphs of source substrate 10 with eight micro-devices 20 separated by anchors 18 covered with organic tether layer 40 material. Micro-devices 20 are of different sizes and aspect ratios (for example ranging from 50 μm by 400 μm to 50 μm by 1200 μm and each micro-device 20 incorporates multiple 3 μm-thick hybrid tethers 16 disposed along micro-device length L on both sides of micro-device 20. Micro-devices 20 are InP optical amplifier coupons comprising gratings interspersed with hybrid tethers 16 along the long sides of micro-devices 20. Hybrid tethers 16 in these experiments comprise a 200 nm SiN deposited by PECVD and an inorganic tether layer 30 comprising a 2.8 μm layer of S1828 deposited by spin coating at 4000 rpm and soft-baked at 115° C. for two minutes. Sacrificial layer 12 comprised InGaAs etched with $FeCl_3$:DI (1:2) at 7° C. The bottom layer of micro-device 20 comprised InP as did source substrate 10. In some embodiments, source substrate 10 and epitaxial layer 24 (micro-device 20) can comprise InP, insulating layer 21 comprises InAlAs etched with $FeCl_3$:DI (de-ionized water) (1:2) at 1-2° C. Some embodiments (not illustrated) comprise GaAs-based materials, for example source substrate 10 and epitaxial layer 24 (e.g., micro-device 20) can comprise GaAs and insulating layer 21 comprises AlGaAs etched with HCl:DI (1:2).

More generally, a variety of material systems can be suitable for micro-devices 20, sacrificial layers 12, and source substrates 10. For example, and without limitation, a semiconductor-on-insulator source wafer 10 can comprise a buried oxide layer (e.g., silicon dioxide) that is etchable with concentrated HF. A GaAs source substrate 10 with sacrificial portion 12 comprising AlGaAs can be etched with HF or HCl. A GaAs source substrate 10 with sacrificial portion 12 comprising InAlP can be etched with HCl. A Si source substrate 10 (e.g., Si (111) with sacrificial portion 12 can be etched with TMAH or KOH). A Silicon-on-insulator source substrate 10 with sacrificial portion 12 comprising Si (100) can be etched with TMAH or KOH. An InP source substrate 10 with sacrificial portion 12 comprising InGa(Al)As can be etched with $FeCl_3$, $H_3PO_4:H_2O_2$, or citric acid:peroxide. An InP(InGaAs) source substrate 10 with sacrificial portion 12 comprising InP can be etched with HCl. A GaSb source substrate 10 with sacrificial portions 12 comprising InGaAlAsSb can be etched with HF. Sacrificial portions 12 comprising Ge can be etched with $H_2O_2$ and sacrificial portions 12 comprising parylene/PI can be etched with an $O_2$ plasma. Other combinations of source substrate 10 material, sacrificial portion 12 material, and etchants can be used as well.

Figure 10:
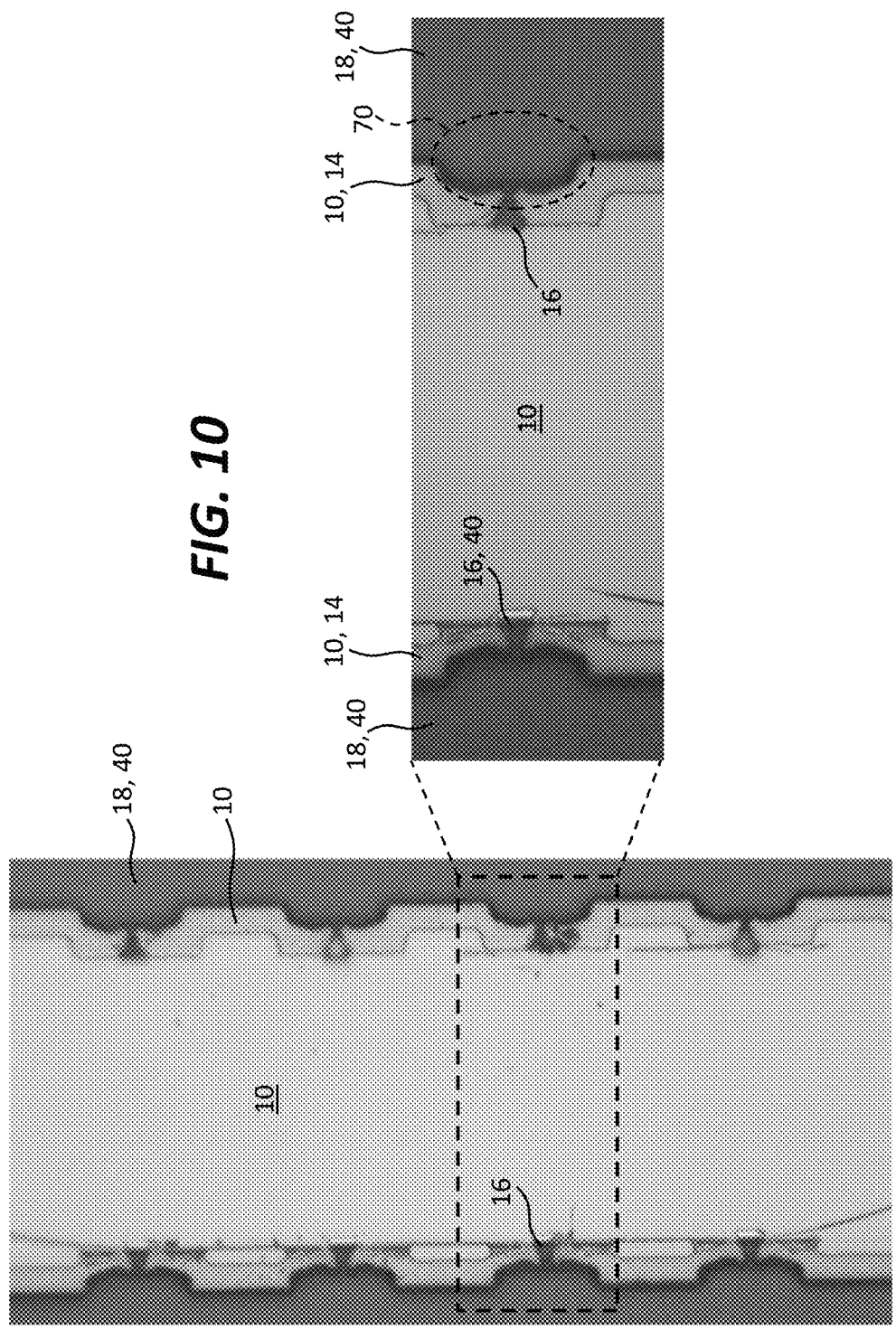
FIG. 10 is a micrograph and detail of a source wafer after removal of micro-devices useful in understanding certain embodiments of the present disclosure.
Figure 11:
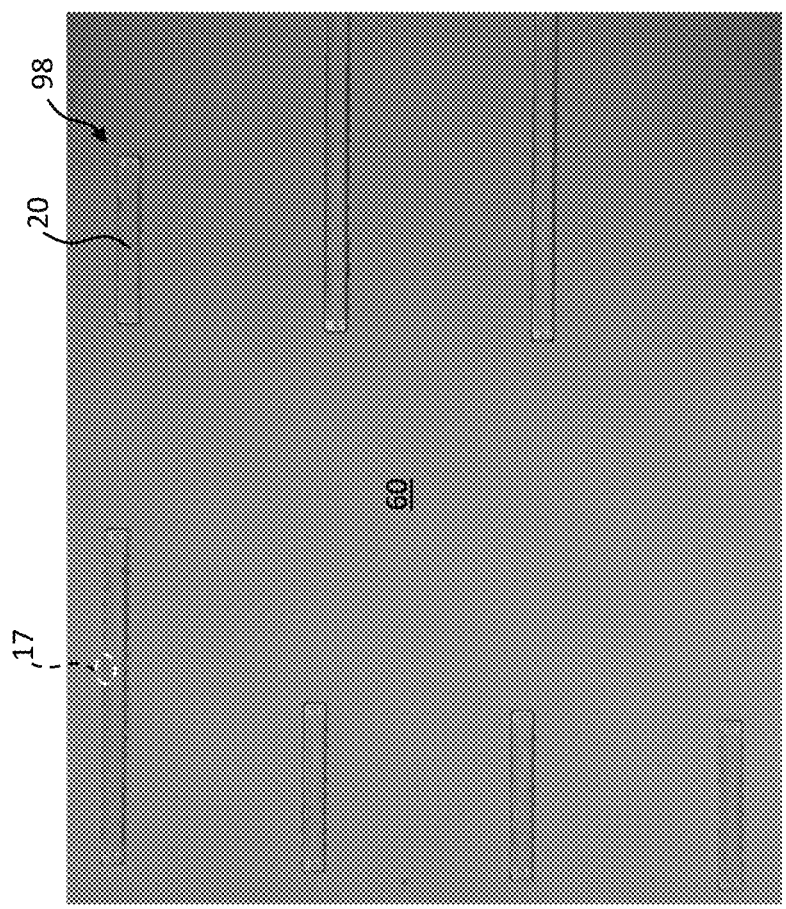
FIG. 11 is a micrograph of a target substrate with micro-transfer printed micro-device structures according to illustrative embodiments of the present disclosure.

FIG. 10 shows in more detail source substrate 10 after micro-devices 20 are removed. The source wafer 10 area directly beneath the removed micro-device appears smoother than the area along the edge (exposed opening 14) because opening 14 is etched for a longer time and is about 400 nm deeper. Fractured hybrid tethers 16 are connected to protrusions 70 of anchor 18. Protrusions 70 facilitate controlled hybrid tether 16 fracturing at a desired location (close to micro-device 20) with few contaminating particles. FIG. 11 shows micro-devices 20 micro-transfer printed onto target substrate 60 that were printed without an additional adhesive layer on target substrate 60, demonstrating that no contaminating particles interfered with the print.

Micro-transfer printing micro-devices 20 comprising different materials from different source wafers 10 to a common target substrate 60 with one or more stamps 50 enables the construction of heterogeneous micro-systems useful in applications for which a small size and a variety of device structures and materials are desirable. The use of hybrid tether 16 enables micro-transfer printing with a wider variety of micro-devices 20 sizes, types, and materials, (in particular, larger micro-devices 20 with greater aspect ratios) thereby realizing a wider variety of micro-systems having micro-devices 20 aligned in closer proximity, for example photonic micro-systems. Hybrid tethers 16 can improve the mechanical properties of tethers during the different phases of the micro-transfer printing process and the yield of the process itself to >99% when the thickness of inorganic tether layer 40 is correctly tuned.

If contact pads 22 are opened (e.g., exposed) before micro-devices 20 are released, an etchant used to etch sacrificial portions 12 can attack a contact pad 22 material, damaging contact pads 22 and degrading any subsequent electrical contact to micro-devices 20. In some embodiments of the present disclosure, contact pads 22 are opened (e.g., exposed) after micro-devices 20 have been micro-transfer printed to a target substrate 60, but this requires an additional target substrate 60 process step and a much greater quantity of expensive patterning materials and more expensive photolithographic equipment (because a target substrate 60 is typically much larger than a source substrate 10). Moreover, removing inorganic or organic tether layer 30, 40 from micro-devices 20 after micro-devices 20 are micro-transfer printed onto target substrate 60 can damage other devices on target substrate 60 that are susceptible to the layer removal process (e.g., an etchant removing inorganic or organic tether layer 30, 40 on target substrate 60 could undesirably etch other devices or structures on target substrate 60 or target substrate 60 itself). By patterning inorganic tether layer 30 and opening contact pads 22 before etching sacrificial portion 12 and releasing micro-devices 20 and then using a blanket coated organic tether layer 40 during sacrificial portion 12 etch, contact pads 22 are protected. In some embodiments, electrical connections to contact pads 22 can then be made by piercing through relatively soft organic tether layer 40 or by etching organic tether layer 40 (e.g., with a relatively benign developer as opposed to harsh etchant(s) that would be needed for etching inorganic tether layer 30). Therefore, some embodiments of the present disclosure require fewer process steps and may utilize steps less likely to possibly cause damage.

As shown for example in FIGS. 9-11, embodiments of the present disclosure have been constructed and tested. In an initial test of source substrate 10 (e.g., as shown in FIG. 9), 100% of micro-devices 20 of different sizes were successfully released and micro-transfer printed. Inorganic tether layers 30 of hybrid tethers 16 comprised a few hundred nm of SiN and organic tether layers 40 comprised resist. Hybrid tethers 16 fractured cleanly very close to or in contact with micro-devices 20 without making problematic contaminating particles. Post-printing, inorganic and organic tether layers 30, 40 were removed by exposing micro-devices to a 20- to 40-minute $O_2$ plasma followed by one minute of $CF_4$ plasma ashing.

According to some embodiments of the present disclosure, micro-devices 20 can be any one or more of integrated circuits, sensors, lasers, laser diodes, and organic or inorganic light-emitting diodes. U.S. Pat. No. 7,799,699 describes methods of making micro-transfer-printable inorganic micro-devices 20, the disclosure of which is hereby incorporated by reference. Structures and elements in accordance with certain embodiments of the present disclosure can be made and assembled using micro-transfer printing methods and materials. In some embodiments, micro-devices 20 are prepared on a native source wafer 10, each type of micro-device 20 prepared on a different source wafer 10 and released for micro-transfer printing with one or more micro-device hybrid tethers 16 physically connecting each micro-device 20 to an anchor 18 of source wafer 10. In certain embodiments, micro-devices 20 are then contacted with a micro-transfer printing stamp 50 to break (e.g., fracture) micro-device hybrid tethers 16 and adhere micro-devices 20 to a transfer stamp 50. Transfer stamp 50 then contacts micro-devices 20 to a target substrate 60, to which micro-devices 20 are then adhered.

For a discussion of micro-transfer printing techniques applicable to (e.g., adaptable to or combinable with) methods disclosed herein see, U.S. Pat. Nos. 8,722,458, 7,622,367 and 8,506,867, the disclosure of each of which are hereby incorporated by reference. Methods of forming micro-transfer printable structures are described, for example, in the paper *AMOLED Displays using Transfer-Printed Integrated Circuits* (Journal of the Society for Information Display, 2011, DOI # 10.1889/JSID19.4.335, 1071-0922/11/1904-0335, pages 335-341) and U.S. Pat. 8,889,485. Micro-transfer printing using compound micro-assembly structures and methods can also be used with certain embodiments of the present disclosure, for example, as described in U.S. patent application Ser. No. 14/822,868, filed Aug. 10, 2015, entitled Compound Micro-Assembly Strategies and Devices, the disclosure of which is hereby incorporated by reference in its entirety. Additional details useful in understanding and performing certain embodiments of the present disclosure are described in U.S. patent application Ser. No. 14/743,981, filed Jun. 18, 2015, entitled Micro Assembled LED Displays and Lighting Elements, the disclosure of which is hereby incorporated by reference in its entirety.

Tethers that are usable with, adaptable for use in, or combinable with tethers disclosed herein are discussed in U.S. Patent Publication No. 2019/0385885 filed Jun. 14, 2018, entitled Multi-Layer Tethers for Micro-Transfer-Printing, and U.S. Pat. No. 10,714,374 filed May 9, 2019, entitled High-Precision Printed Structures, whose contents are incorporated herein by reference.

As is understood by those skilled in the art, the terms "over", "under", "above", "below", "beneath", and "on" are relative terms and can be interchanged in reference to different orientations of the layers, elements, and substrates included in the present disclosure. For example, a first layer on a second layer, in some embodiments means a first layer directly on and in contact with a second layer. In other embodiments, a first layer on a second layer can include another layer there between.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously.

Having described certain embodiments, it will now become apparent to one of skill in the art that other embodiments incorporating the concepts of the disclosure may be used. Therefore, the claimed invention should not be limited to the described embodiments, but rather should be limited only by the spirit and scope of the following claims.

PARTS LIST

A-A' cross section
L micro-device length
W micro-device width
10 source substrate/source wafer
12 sacrificial portion
13 gap
14 opening
16 hybrid tether
16A tether anchor portion
16C tether connection portion
16D tether device portion
17 flap/broken tether
18 anchor
19 inorganic tether layer etchant
20 micro-device
21 insulating layer
22 contact pad
24 micro-device layer/epitaxial layer
26 layer
28 layer
30 inorganic tether layer
40 organic tether layer
50 stamp
52 post
60 target substrate
62 structure/alignment structure
70 protrusion
98 micro-device structure
99 micro-device structure
100 provide source substrate step
105 dispose micro-device step
110 deposit inorganic layer step
115 open contact pads and sacrificial layer opening step
120 deposit organic layer step
125 pattern organic layer step
127 pattern inorganic layer to form sacrificial layer opening step
130 release micro-devices step
135 remove organic layer step
140 remove inorganic tether layer step
150 micro-transfer print micro-device step

What is claimed:

1. A micro-device structure, comprising:
a source substrate comprising sacrificial portions laterally spaced apart by anchors, wherein at least a portion of each of the sacrificial portions is exposed through an opening; and
a micro-device disposed exclusively on each of the sacrificial portions and laterally attached to one of the anchors by a hybrid tether,
wherein the hybrid tether comprises an organic tether layer and an inorganic tether layer.

2. The micro-device structure of claim 1, wherein the inorganic tether layer is disposed between the organic tether layer and the source substrate.

3. The micro-device structure of claim 1, wherein (i) the inorganic tether layer comprises silicon nitride, silicon dioxide, or amorphous silicon, (ii) the organic tether layer comprises photoresist, or (iii) both (i) and (ii).

4. The micro-device structure of claim 3, wherein the organic tether layer comprises positive photoresist.

5. The micro-device structure of claim 1, wherein (i) the organic tether layer extends over at least a portion of the micro-device, (ii) the inorganic tether layer extends over at least a portion of the micro-device, or (iii) both (i) and (ii).

6. The micro-device structure of claim 1, wherein (i) the organic tether layer encapsulates the micro-device, (ii) the inorganic tether layer encapsulates the micro-device, or (iii) both (i) and (ii).

7. The micro-device structure of claim 1, wherein (i) the sacrificial portions comprise a sacrificial material that is an anisotropically etchable material or (ii) the sacrificial portions comprise a sacrificial material that is a different material from a material of the source substrate, and wherein the sacrificial material is differentially etchable from the material of the source substrate.

8. The micro-device structure of claim 1, wherein the sacrificial portions comprise a sacrificial material that is a same material as a material of the source substrate.

9. The micro-device structure of claim 1, wherein the micro-device has a micro-device length and a micro-device width and the micro-device length is five to twenty times greater than the micro-device width.

10. The micro-device structure of claim 1, wherein (i) the micro-device is disposed in a micro-device layer and (ii) the hybrid tether comprises a tether device portion disposed at least partly on or over the micro-device, a tether anchor portion disposed at least partly on or over the anchor, and a tether connection portion connecting the tether device portion to the tether anchor portion, wherein the hybrid tether is physically continuous and the hybrid tether is disposed at least partly in the micro-device layer laterally between the micro-device and the device anchor.

11. The micro-device structure of claim 10, wherein the tether device portion and the tether anchor portion are at least partly disposed in a layer farther from the source substrate than the tether connection portion.

12. The micro-device structure of claim 1, wherein the hybrid tether is a first hybrid tether and the micro-device is laterally attached to the one of the anchors by a second hybrid tether that is not the first hybrid tether,
wherein the second hybrid tether comprises an organic tether layer and an inorganic tether layer.

13. A micro-device structure, comprising:
a micro-device; and
at least a portion of a hybrid tether connected to the micro-device, the hybrid tether comprising an organic tether layer and an inorganic tether layer.

14. The micro-device structure of claim 13, wherein the at least a portion of the hybrid tether is a flap.

15. A micro-device structure, comprising:
a source substrate comprising sacrificial portions laterally spaced apart by anchors, wherein at least a portion of each of the sacrificial portions is exposed through an opening; and
a micro-device disposed exclusively on each of the sacrificial portions and laterally attached to one of the anchors by a hybrid tether,
wherein the hybrid tether comprises an organic tether layer and an inorganic tether layer and the organic tether layer is thicker than the inorganic tether layer.

16. The micro-device structure of claim 15, wherein the organic tether layer is 1.5 to 15 times thicker than the inorganic tether layer.

17. The micro-device structure of claim 15, wherein (i) the inorganic tether layer is no less than fifty nm thick and no greater than two lam thick, (ii) the organic tether layer is no less than one lam thick and no greater than five lam thick, or (iii) both (i) and (ii).

18. A micro-device structure, comprising:
a source substrate comprising sacrificial portions laterally spaced apart by anchors, wherein at least a portion of each of the sacrificial portions is exposed through an opening; and
a micro-device disposed exclusively on each of the sacrificial portions and laterally attached to one of the anchors by a hybrid tether,
wherein the hybrid tether comprises an organic tether layer and an inorganic tether layer, the micro-device comprises one or more contact pads, the organic tether layer encapsulates the micro-device except for the one or more contact pads, and the inorganic tether layer encapsulates the micro-device including the one or more contact pads.

19. A micro-device structure, comprising:
a source substrate comprising sacrificial portions laterally spaced apart by anchors, wherein at least a portion of each of the sacrificial portions is exposed through an opening; and
a micro-device disposed exclusively on each of the sacrificial portions and laterally attached to one of the anchors by a hybrid tether,
wherein (i) the hybrid tether comprises an organic tether layer and an inorganic tether layer, (ii) the micro-device has a micro-device length greater than or equal to 200 lam and less than or equal to 2400 lam and a micro-device width greater than or equal to 40 lam and less than or equal to 120 lam, and (iii) the inorganic tether layer has a thickness of from 50 nm to 500 nm and the organic tether layer has a thickness of from 500 nm to 6 µm.

* * * * *

UNITED STATES PATENT AND TRADEMARK OFFICE
CERTIFICATE OF CORRECTION

PATENT NO.            : 12,057,340 B2
APPLICATION NO.  : 17/112153
DATED                     : August 6, 2024
INVENTOR(S)         : Ruggero Loi Page 1 of 1

It is certified that error appears in the above-identified patent and that said Letters Patent is hereby corrected as shown below:

In the Claims

At Column 22 Lines 1-2, in Claim 17, please replace:
"no greater than two lam thick, (ii) the organic tether layer is no less than one lam thick and no greater than five lam thick,"
With:
--no greater than two μm thick, (ii) the organic tether layer is no less than one μm thick and no greater than five μm thick,--

At Column 22 Lines 29-31, in Claim 19, please replace:
"lam and less than or equal to 2400 lam and a micro-device width greater than or equal to 40 lam and less than or equal to 120 lam, and (iii) the inorganic tether"
With:
--μm and less than or equal to 2400 μm and a micro-device width greater than or equal to 40 μm and less than or equal to 120 μm, and (iii) the inorganic tether--

Signed and Sealed this
Seventh Day of October, 2025

John A. Squires
*Director of the United States Patent and Trademark Office*